US008502573B2

(12) United States Patent  (10) Patent No.: US 8,502,573 B2
Tsai  (45) Date of Patent: *Aug. 6, 2013

(54) FREQUENCY DIVIDER FOR GENERATING OUTPUT CLOCK SIGNAL WITH DUTY CYCLE DIFFERENT FROM DUTY CYCLE OF INPUT CLOCK SIGNAL

(71) Applicant: Mediatek Inc., Hsin-Chu (TW)

(72) Inventor: Ming-Da Tsai, Miaoli County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/658,809

(22) Filed: Oct. 23, 2012

(65) Prior Publication Data

US 2013/0043913 A1 Feb. 21, 2013

Related U.S. Application Data

(63) Continuation of application No. 12/959,341, filed on Dec. 2, 2010, now Pat. No. 8,314,639.

(60) Provisional application No. 61/316,925, filed on Mar. 24, 2010.

(51) Int. Cl.
*H03K 21/00* (2006.01)

(52) U.S. Cl.
USPC .............. 327/115; 327/117; 327/175; 377/47

(58) Field of Classification Search
USPC ................... 327/115, 117, 118, 175; 377/47, 377/48
See application file for complete search history.

(56) References Cited

U.S. PATENT DOCUMENTS

| | | | |
|---|---|---|---|
| 3,317,843 A | 5/1967 | Emmons | |
| 3,571,728 A | 3/1971 | Andrea | |
| 3,789,304 A | 1/1974 | May | |
| 3,902,125 A | 8/1975 | Oliva | |

(Continued)

FOREIGN PATENT DOCUMENTS

| | | |
|---|---|---|
| CN | 101213749 A | 7/2008 |
| JP | 63144623 A | 6/1988 |
| WO | 2009003101 A2 | 12/2008 |

OTHER PUBLICATIONS

Kaczman, A Single-Chip 10-Band WCDMA/HSDPA 4-Band GSM/EDGE SAW-less CMOS Receiver With DigRF 3G Interface and πdBm IIP2, IEEE Journal of Solid-State Circuits, vol. 44, No. 3, pp. 718-739, Mar. 2009.

(Continued)

*Primary Examiner* — William Hernandez
(74) *Attorney, Agent, or Firm* — Winston Hsu; Scott Margo

(57) ABSTRACT

A frequency divider includes a plurality of logic circuit blocks. Each of the logic circuit blocks has a plurality of control terminals. At least one of the control terminals of one of the logic circuit blocks is arranged to receive an input clock signal having a first duty cycle. At least one of the remaining control terminals of the one of the logic circuit blocks is arranged to couple another one of the logic circuit blocks by a positive feedback. A clock signal at the at least one of the remaining control terminals has a second duty cycle different from the first duty cycle. Each of the logic circuit blocks includes a plurality of first transistors coupled in parallel between a first reference voltage and an output terminal, and a plurality of second transistors coupled in series between a second reference voltage and the output terminal.

17 Claims, 50 Drawing Sheets

(56) References Cited

U.S. PATENT DOCUMENTS

| | | |
|---|---|---|
| 4,366,394 A | 12/1982 | Clendening |
| 4,390,960 A | 6/1983 | Yamashita |
| 4,439,689 A | 3/1984 | Chazenfus |
| 5,172,400 A | 12/1992 | Maemura |
| 6,831,493 B2 | 12/2004 | Ma |
| 6,847,239 B2 | 1/2005 | Leifso |
| 7,545,191 B2 | 6/2009 | Austin |
| 7,646,323 B2 | 1/2010 | Pickering |
| 2009/0121763 A1 | 5/2009 | Bossu |

OTHER PUBLICATIONS

Razavi, Design of High-Speed, Low-Power Frequency Dividers and Phase-Locked Loops in Deep Submicron CMOS, IEEE Journal of Solid-State Circuits, vol. 30, No. 2, pp. 101-109, Feb. 1995.

| Z | X | Y |
|---|---|---|
| I | $Q_b/I_b$ | $I_b/Q_b$ |
| I | $CK/I_b$ | $I_b/CK$ |
| $I_b$ | $Q/I$ | $I/Q$ |
| $I_b$ | $CK/I$ | $I/CK$ |
| Q | $I/Q_b$ | $Q_b/I$ |
| Q | $CK_b/Q_b$ | $Q_b/CK_b$ |
| $Q_b$ | $Q/I_b$ | $I_b/Q$ |
| $Q_b$ | $CK_b/Q$ | $Q/CK_b$ |

FIG. 4

| Z | X | Y |
|---|---|---|
| I | CK/$I_b$ | $I_b$/CK |
| I | $Q_b$/$I_b$ | $I_b$/$Q_b$ |
| $I_b$ | CK/I | I/CK |
| $I_b$ | Q/I | I/Q |
| Q | $CK_b$/$Q_b$ | $Q_b$/$CK_b$ |
| Q | I/$Q_b$ | $Q_b$/I |
| $Q_b$ | $CK_b$/Q | Q/$CK_b$ |
| $Q_b$ | $I_b$/Q | Q/$I_b$ |

FIG. 6

| Z | X | Y |
|---|---|---|
| I' | CK/$I_b$' | $I_b$'/CK |
| I' | $I_b$'/Q' | Q'/$I_b$' |
| $I_b$' | CK/I' | I'/CK |
| $I_b$' | I'/$Q_b$' | $Q_b$'/I' |
| Q' | $CK_b$/$Q_b$' | $Q_b$'/$CK_b$ |
| Q' | $I_b$'/$Q_b$' | $Q_b$'/$I_b$' |
| $Q_b$' | $CK_b$/Q' | Q'/$CK_b$ |
| $Q_b$' | I'/Q' | Q'/I' |

FIG. 9

| Z | X | Y |
|---|---|---|
| I' | $I_b'/Q'$ | $Q'/I_b'$ |
| I' | $CK/I_b'$ | $I_b'/CK$ |
| $I_b'$ | $I'/Q_b'$ | $Q_b'/I'$ |
| $I_b'$ | $CK/I'$ | $I'/CK$ |
| Q' | $I_b'/Q_b'$ | $Q_b'/I_b'$ |
| Q' | $CK_b/Q_b'$ | $Q_b'/CK_b$ |
| $Q_b'$ | $I'/Q'$ | $Q'/I'$ |
| $Q_b'$ | $CK_b/Q'$ | $Q'/CK_b$ |

FIG. 11

| Z | X | Y |
|---|---|---|
| I | $Q_b$/CK | CK/$Q_b$ |
| I | CK/$I_b$ | $I_b$/CK |
| $I_b$ | Q/CK | CK/Q |
| $I_b$ | CK/I | I/CK |
| Q | I/$CK_b$ | $CK_b$/I |
| Q | $CK_b$/$Q_b$ | $Q_b$/$CK_b$ |
| $Q_b$ | $CK_b$/$I_b$ | $I_b$/$CK_b$ |
| $Q_b$ | $CK_b$/Q | Q/$CK_b$ |

FIG. 30

| Z | X | Y |
|---|---|---|
| I | CK/$I_b$ | $I_b$/CK |
| I | $Q_b$/CK | CK/$Q_b$ |
| $I_b$ | CK/I | I/CK |
| $I_b$ | Q/CK | CK/Q |
| Q | $CK_b$/$Q_b$ | $Q_b$/$CK_b$ |
| Q | I/$CK_b$ | $CK_b$/I |
| $Q_b$ | $CK_b$/Q | Q/$CK_b$ |
| $Q_b$ | $I_b$/$CK_b$ | $CK_b$/$I_b$ |

FIG. 31

| Z | X | Y |
|---|---|---|
| I' | CK/I$_b$' | I$_b$'/CK |
| I' | CK/Q' | Q'/CK |
| I$_b$' | CK/I' | I'/CK |
| I$_b$' | CK/Q$_b$' | Q$_b$'/CK |
| Q' | CK$_b$/Q$_b$' | Q$_b$'/CK$_b$ |
| Q' | I$_b$'/CK$_b$ | CK$_b$/I$_b$' |
| Q$_b$' | CK$_b$/Q' | Q'/CK$_b$ |
| Q$_b$' | I'/CK$_b$ | CK$_b$/I' |

FIG. 32

| Z | X | Y |
|---|---|---|
| I' | CK/Q' | Q'/CK |
| I' | CK/I$_b$' | I$_b$'/CK |
| I$_b$' | CK/Q$_b$' | Q$_b$'/CK |
| I$_b$' | CK/I' | I'/CK |
| Q' | I$_b$'/CK$_b$ | CK$_b$/I$_b$' |
| Q' | CK$_b$/Q$_b$' | Q$_b$'/CK$_b$ |
| Q$_b$' | I'/CK$_b$ | CK$_b$/I' |
| Q$_b$' | CK$_b$/Q' | Q'/CK$_b$ |

FIG. 33

FREQUENCY DIVIDER FOR GENERATING OUTPUT CLOCK SIGNAL WITH DUTY CYCLE DIFFERENT FROM DUTY CYCLE OF INPUT CLOCK SIGNAL

CROSS REFERENCE TO RELATED APPLICATIONS

This is a continuation of co-pending U.S. application Ser. No. 12/959,341 (filed on Dec. 2, 2010), which claims the benefit of U.S. Provisional Application No. 61/316,925 (filed on Mar. 24, 2010). The entire contents of the related applications are incorporated herein by reference.

BACKGROUND

The disclosed embodiments of the present invention relate to dividing a frequency of an input clock signal, and more particularly, to a frequency divider capable of generating an output clock signal with a duty cycle different from an input clock signal's duty cycle.

A frequency divider is commonly used for dividing a frequency of an input clock signal to thereby generate an output clock signal with a lower frequency. In a conventional design, the frequency divider aims at changing the frequency without modifying the duty cycle. That is, the duty cycle of the output clock signal generated from the conventional frequency divider is identical to the duty cycle of the input clock signal. However, in certain applications, a clock signal with a duty cycle smaller than an input clock's duty cycle (e.g., 50%) may be desired. For example, regarding a wireless receiver having mixers coupled to the same radio-frequency signal input and a common local oscillator (LO), LO signals each having a duty cycle of 25% are desired by the mixers respectively disposed in the in-phase (I) path and the quadrature (Q) path for reducing the unwanted noise introduced to the following signal processing stage. For example, the common local oscillator generates high-frequency input clock signals with a duty cycle of 50%, and a conventional frequency divider generates low-frequency output clock signals with a duty cycle of 50% according to the high-frequency input clock signals. To obtain desired clock signals with a duty cycle of 25%, a signal processing circuit is particularly implemented to process the output clock signals and/or the input clock signals of the conventional frequency divider. That is, the desired clock signals with the duty cycle of 25% are generated from the signal processing circuit external to the frequency divider.

In a case where each desired clock signal with the duty cycle of 25% is derived from a clock-gating topology which gates one output clock signal of the conventional frequency divider by one input clock signal of the conventional frequency divider, the I/Q imbalance of the receiver is very sensitive to the input clock phase error as the LO signals are generated from the signal processing circuit (i.e., a clock-gating circuit). In another case where each desired clock signal with the duty cycle of 25% is derived from a clock-gating topology which gates one output clock signal of the conventional frequency divider by another output clock signal of the conventional frequency divider, the driving capability of the desired clock signal may be weak due to imperfect rising/falling waveforms of the output clock signals processed by the signal processing circuit (i.e., a clock-gating circuit).

Thus, there is a need for an innovative frequency divider design which can directly generate the output clock signals with the duty cycle different from that of the input clock signal, thereby avoiding the use of the aforementioned clock-gating circuit.

SUMMARY

In accordance with exemplary embodiments of the present invention, a frequency divider capable of generating an output clock signal with a duty cycle different from an input clock signal's duty cycle is proposed.

According to an aspect of the present invention, an exemplary frequency divider is disclosed. The exemplary frequency divider includes a plurality of logic circuit blocks. Each of the logic circuit blocks has a plurality of control terminals. At least one of the control terminals of one of the logic circuit blocks is arranged to receive an input clock signal having a first duty cycle. At least one of the remaining control terminals of the one of the logic circuit blocks is arranged to couple another one of the logic circuit blocks by a positive feedback. A clock signal at the at least one of the remaining control terminals has a second duty cycle different from the first duty cycle. Each of the logic circuit blocks includes a plurality of first transistors coupled in parallel between a first reference voltage and an output terminal, and a plurality of second transistors coupled in series between a second reference voltage and the output terminal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a table illustrating connection configurations of the logic circuit shown in FIG. 3.

FIG. 6 is a table illustrating connection configurations of the logic circuit shown in FIG. 5.

FIG. 9 is a table illustrating connection configurations of the logic circuit shown in FIG. 8.

FIG. 11 is a table illustrating connection configurations of the logic circuit shown in FIG. 10.

FIG. 30 shows another table illustrating connection configurations of the logic circuit shown in FIG. 3.

FIG. 31 shows another table illustrating connection configurations of the logic circuit shown in FIG. 5.

FIG. 32 shows another table illustrating connection configurations of the logic circuit shown in FIG. 8.

FIG. 33 shows another table illustrating connection configurations of the logic circuit shown in FIG. 10.

DETAILED DESCRIPTION

Figure 1:
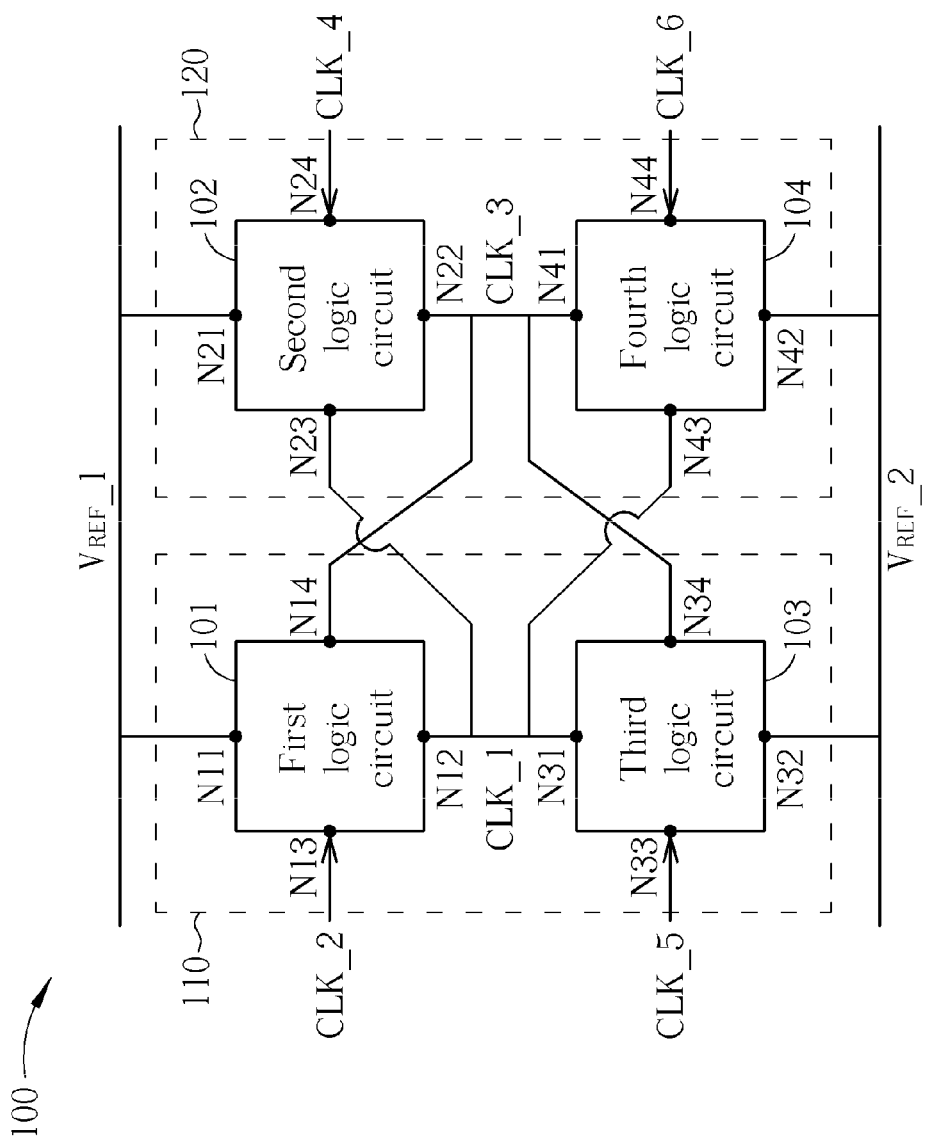
FIG. 1 is a diagram illustrating a frequency divider according to a first exemplary embodiment of the present invention.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

The conception of the present invention is to use a frequency divider to directly generate output clock signals with a second duty cycle different from a first duty cycle of input clock cycles. In this way, no additional conventional clock-gating circuit is needed to further process one input and one output or two outputs of the frequency divider. Please refer to FIG. 1, which is a diagram illustrating a frequency divider according to a first exemplary embodiment of the present invention. The exemplary frequency divider 100 is arranged to process an input clock signal with a first duty cycle (e.g., a duty cycle substantially equal to 50%), and includes, but is not limited to, a plurality of logic circuit blocks including a first logic circuit block 110 and a second logic circuit block 120. The logic circuit blocks are realized using a plurality of logic circuits including a first logic circuit 101, a second logic circuit 102, a third logic circuit 103, and a fourth logic circuit 104. As can be seen from FIG. 1, the first logic circuit block 110 of this exemplary embodiment includes the first logic circuit 101 and the third logic circuit 103, and the second logic circuit block 120 of this exemplary embodiment includes the second logic circuit 102 and the fourth logic circuit 104. The first logic circuit 101 has a first node N11 arranged to receive a first reference voltage $V_{REF\_1}$, a second node N12 arranged to output a first clock signal CLK_1, a third node N13 arranged to receive a second clock signal CLK_2, and a fourth node N14 arranged to receive a third clock signal CLK_3. The first logic circuit 101 is arranged to control the first clock signal CLK_1 according to the first reference voltage $V_{REF\_1}$, the second clock signal CLK_2, and the third clock signal CLK_3. Regarding the second logic circuit 102, it has a first node N21 arranged to receive the first reference voltage $V_{REF\_1}$, a second node N22 arranged to output the third clock signal CLK_3, a third node N23 arranged to receive the first clock signal CLK_1, and a fourth node N24 arranged to receive a fourth clock signal CLK_4. The second logic circuit 102 is arranged to control the third clock signal CLK_3 according to the first reference voltage $V_{REF\_1}$, the first clock signal CLK_1, and the fourth clock signal CLK_4. Regarding the third logic circuit 103, it has a first node N31 coupled to the second node N12 of the first logic circuit 101 and arranged to output the first clock signal CLK_1, a second node N32 arranged to receive a second reference voltage $V_{REF\_2}$, a third node N33 arranged to receive a fifth clock signal CLK_5, and a fourth node N34 arranged to receive the third clock signal CLK_3. The third logic circuit 103 is arranged to control the first clock signal CLK_1 according to the second reference voltage $V_{REF\_2}$, the fifth clock signal CLK_5, and the third clock signal CLK_3. Regarding the fourth logic circuit 104, it has a first node N41 coupled to the second node N22 of the second logic circuit 102 and arranged to output the third clock signal CLK_3, a second node N42 arranged to receive the second reference voltage $V_{REF\_2}$, a third node N43 arranged to receive the first clock signal CLK_1, and a fourth node N44 arranged to receive a sixth clock signal CLK_6. The fourth logic circuit 104 is arranged to control the third clock signal CLK_3 according to the second reference voltage $V_{REF\_2}$, the sixth clock signal CLK_6, and the first clock signal CLK_1.

The first reference voltage $V_{REF\_1}$ is different from the second reference voltage $V_{REF\_2}$. In one exemplary embodiment, the first reference voltage $V_{REF\_1}$ may be higher than the second reference voltage $V_{REF\_2}$; however, in another exemplary embodiment, the first reference voltage $V_{REF\_1}$ may be lower than the second reference voltage $V_{REF\_2}$. To put it simply, the first reference voltage $V_{REF\_1}$ and the second reference voltage $V_{REF\_2}$ should be properly set according to the actual configuration of the frequency divider 110.

It should be noted that at least one clock signal of the second clock signal CLK_2, the fourth clock signal CLK_4, the fifth clock signal CLK_5, and the sixth clock signal CLK_6 is the input clock signal CLK_IN of the frequency divider 100. For example, in one exemplary implementation, the high-frequency input clock signal CLK_IN may be fed into the third node N33 of the third logic circuit 103 and the fourth node N44 of the fourth logic circuit 104 (i.e., CLK_5=CLK_IN & CLK_6=CLK_IN). In another exemplary implementation, the input clock signal CLK_IN may be fed into the third node N13 of the first logic circuit 101 and the fourth node N24 of the second logic circuit 102 (i.e., CLK_2=CLK_IN & CLK_4=CLK_IN). However, this is for illustrative purposes only. As detailed in the following paragraphs, it is possible that only one of the second clock signal CLK_2, the fourth clock signal CLK_4, the fifth clock signal CLK_5, and the sixth clock signal CLK_6 is the input clock signal CLK_IN. It should be noted that all of the first clock signal CLK_1, the second clock signal CLK_2, the third clock signal CLK_3, the fourth clock signal CLK_4, the fifth clock signal CLK_5, and the sixth clock signal CLK_6, except the at least one clock signal being the input clock signal CLK_IN with the first duty cycle, have a second duty cycle different from the first duty cycle. For example, in a case where the input clock signal CLK_IN serves as the fifth clock signal CLK_5 and the sixth clock signal CLK_6 shown in FIG. 1, each of the first clock signal CLK_1, the second clock signal CLK_2, the third clock signal CLK_3, the fourth clock signal CLK_4 has the second duty cycle such as a duty cycle substantially equal to 25% or 75%. In another case where the input clock signal CLK_IN serves as the second clock signal CLK_2 and the fourth clock signal CLK_4, each of the first clock signal CLK_1, the third clock signal CLK_3, the fifth clock signal CLK_5, and the sixth clock signal CLK_6 has the second duty cycle such as a duty cycle substantially equal to 25% or 75%.

Ideally, the first duty cycle is exactly equal to a first expected value such as 50%, and the second duty cycle is exactly equal to a second expected value such as 25% or 75%. However, regarding an actual implementation, the first duty cycle may be deviated from the first expected value and the second duty cycle may be deviated from the second expected value due to certain factors such as signal propagation delay, signal processing delay, temperature variation, process variation, etc. However, no matter whether the first duty cycle is exactly equal to the first expected value or deviated from the first expected value due to certain factors, the first duty cycle should be still regarded as being substantially equal to the first expected value (e.g., 50%). Similarly, no matter whether the second duty cycle is exactly equal to the second expected value or deviated from the second expected value due to certain factors, the second duty cycle should be still regarded as being substantially equal to the second expected value (e.g., 25% or 75%).

In addition, please note that at least one of the first clock signal CLK_1 and the third clock signal CLK_3 may serve as an output clock signal of the frequency divider 100. For example, the first clock signal CLK_1 generated at an output terminal (i.e., N12/N31) and the third clock signal CLK_3 generated at an output terminal (i.e., N22/N41) have the same duty cycle and frequency but different phases. Thus, one or both of the first clock signal CLK_1 and the third clock signal CLK_3 may be used by a following signal processing stage, depending upon the actual design consideration. For example, regarding a single-ended application, only one of the first clock signal CLK_1 and the third clock signal CLK_3 may be used by the following signal processing stage. However, regarding a differential application, both of the first clock signal CLK_1 and the third clock signal CLK_3 may be used by the following signal processing stage.

Nodes N13, N14, N23, N24, N33, N34, N43, and N44 may be regarded as control terminals of the first logic circuit block 110 and the second logic circuit block 120. Thus, at least one of the control terminals of one logic circuit block is arranged to receive an input clock signal having a first duty cycle (e.g., a duty cycle substantially equal to 50%), and at least one of the remaining control terminals of the logic circuit blocks is arranged to couple another logic circuit by a positive feedback, where a clock signal at the at least one of the remaining control terminals has a second duty cycle (e.g., a duty cycle substantially equal to 25% or 75%) different from the first duty cycle. The positive feedback may be realized by a cross-coupled connection. As shown in FIG. 1, the frequency divider 100 has a cross-coupled circuit architecture implemented therein. More specifically, an output of the first logic circuit 101 (i.e., the first clock signal CLK_1) serves as one input of the second logic circuit 102, and an output of the second logic circuit 102 (i.e., the third clock signal CLK_3) serves as one input of the first logic circuit 101. Thus, there is positive feedback between the first logic circuit 101 and the second logic circuit 102 due to a cross-coupled connection between nodes N12, N23, N14, and N22. Similarly, an output of the third logic circuit 103 (i.e., the first clock signal CLK_1) serves as one input of the fourth logic circuit 104, and an output of the fourth logic circuit 104 (i.e., the third clock signal CLK_3) serves as one input of the third logic circuit 103. Therefore, there is a positive feedback between the third logic circuit 103 and the fourth logic circuit 104 due to a cross-coupled connection between nodes N31, N43, N34, and N41.

With properly settings of the logic circuits, including the first logic circuit 101, the second logic circuit 102, the third logic circuit 103, and the fourth logic circuit 104, and the clock signals, including the second clock signal CLK_2, the fourth clock signal CLK_4, the fifth clock signal CLK_5, and the sixth clock signal CLK_6 (it should be noted that at least one of these clock signals is the input clock signal with the first duty cycle), each of the first clock signal CLK_1 and the third clock signal CLK_3 internally generated by the frequency divider 100 would have the second duty cycle different from the first duty cycle due to such a circuit architecture shown in FIG. 1.

Figure 2:
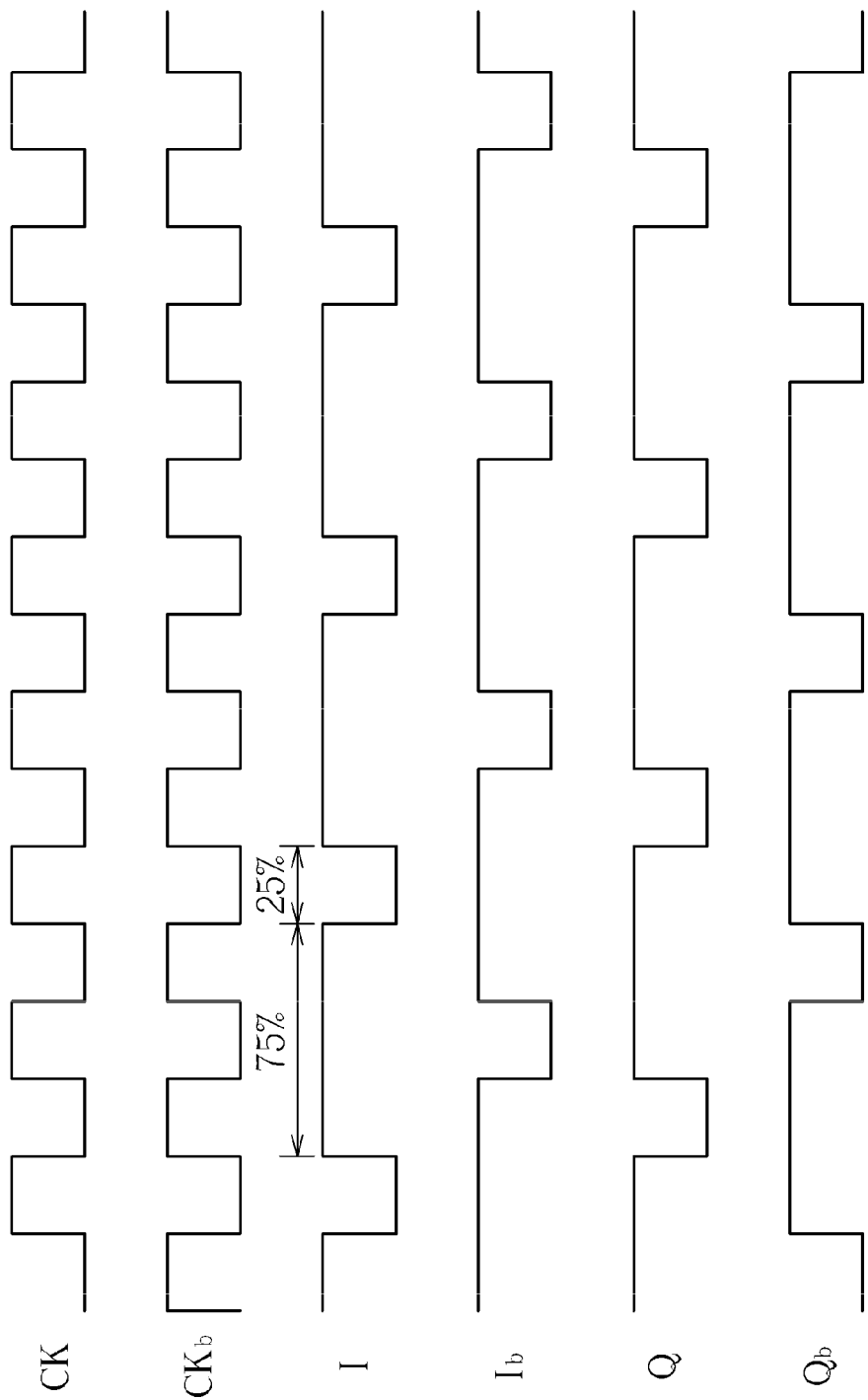
FIG. 2 is a diagram illustrating waveforms of possible input clock signals and output clock signals of a frequency divider according to a first frequency divider design.

FIG. 2 is a diagram illustrating waveforms of possible input clock signals and output clock signals of a frequency divider according to a first frequency divider design. By way of example, but not limitation, any clock signal received/processed/generated by the exemplary frequency divider 100 shown in FIG. 1 may have a corresponding waveform that is shown in FIG. 2. At least one of the clock signals CK and $CK_b$ having a duty cycle which is substantially equal to 50% may be fed into the exemplary frequency divider 100 to act as the input clock signal, and at least one of the clock signals I, $I_b$, Q, and $Q_b$ having a duty cycle which is substantially equal to 75% may be generated from the exemplary frequency divider 100 to act as the output clock signal supplied to a following signal processing stage (not shown). As shown in FIG. 2, the clock signals CK and $CK_b$ have a 180-degree phase difference therebetween, clock signals I and $I_b$ have a 180-degree phase difference therebetween, and clock signals Q and $Q_b$ have a 180-degree phase difference therebetween. In addition, the clock signals I and Q have a 90-degree phase difference therebetween, and the clock signals $I_b$ and $Q_b$ have a 90-degree phase difference therebetween. In the following, several feasible logic circuit implementations are provided, wherein any of the first logic circuit 101, the second logic circuit 102, the third logic circuit 103, and the fourth logic circuit 104 may be realized using one of the exemplary logic circuit implementations.

Figure 3:
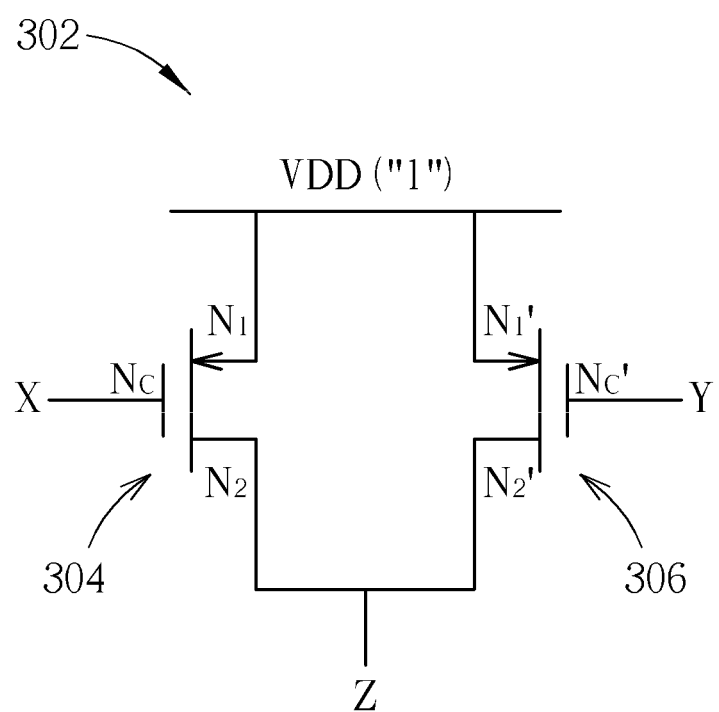
FIG. 3 is a diagram illustrating a first logic circuit implementation according to an exemplary embodiment of the present invention.

FIG. 3 is a diagram illustrating a first logic circuit implementation according to an exemplary embodiment of the present invention. The logic circuit 302 including two P-channel metal-oxide-semiconductor (PMOS) transistors 304 and 306 connected in a parallel manner. As shown in the figure, the PMOS transistor 304 has a control terminal (i.e., a gate terminal) $N_C$ arranged to receive a first input signal X, a first connection terminal (i.e., a source terminal) $N_1$ coupled to a logic high level "1" (e.g., a high supply voltage/supplied power voltage VDD), and a second connection terminal (i.e., a drain terminal) $N_2$ arranged to output an output signal Z. Regarding the other PMOS transistor 306, it has a control terminal (i.e., a gate terminal) $N_C'$ arranged to receive a second input signal Y, a first connection terminal (i.e., a source terminal) $N_1'$ coupled to the logic high level "1" (e.g., the high supply voltage VDD), and a second connection terminal (i.e., a drain terminal) $N_2$ arranged to output the output signal Z. The logic circuit 302 can be though as a switch circuit controlled by the input signals presented at the gate terminals of the PMOS transistors 304 and 306. More specifically, the logic circuit 302 makes the output signal Z have the logic high level "1" when at least one of the input signals X and Y has a logic low level "0" (e.g., a low supply voltage/signal ground VSS). That is, Z=1 if X=0 or Y=0.

In view of above, the logic circuit 302 may be employed to control the generation of the output signal Z being one of the clock signals I, $I_b$, Q, and $Q_b$ when the input signals X and Y are properly set. Please refer to FIG. 4, which is a table illustrating connection configurations of the logic circuit 302 shown in FIG. 3. For example, when the output signal Z is desired to be the clock signal I shown in FIG. 2, the control terminal $N_c$ of the PMOS transistor 304 may be arranged to receive the clock signal $Q_b$ shown in FIG. 2, and the control terminal $N_c'$ of the PMOS transistor 306 may be arranged to receive the clock signal $I_b$ shown in FIG. 2. Please note that the inputs at the control terminals of the PMOS transistors 304 and 306 are interchangeable. Therefore, in an alternative design, the control terminal $N_c$ of the PMOS transistor 304 may be arranged to receive the clock signal $I_b$ shown in FIG. 2, and the control terminal $N_c'$ of the PMOS transistor 306 may be arranged to receive the clock signal $Q_b$ shown in FIG. 2. Only some of the possible connection configurations of the logic circuit 302 are included in the table shown in FIG. 4. That is, as long as the spirit of the present invention is obeyed, other connection configurations not included in the table are feasible.

It should be noted that FIG. 4 simply shows possible options of signals which may be presented at nodes of the logic circuit 302 when the logic circuit 302 is employed in a frequency divider. As the logic circuit 302 is capable of pulling a signal level of the output signal Z to the logic high level "1" each time one of the first input signal X and the second input signal Y has the logic low level "0" and has no capability of pulling the signal level of the output signal Z to the logic low level "0", the logic circuit 302 therefore has to collaborate with other logic circuit(s) also implemented in the frequency divider to make the output signal Z become a clock signal which switches to the logic high level "1" and the logic low level "0" alternately.

Figure 5:
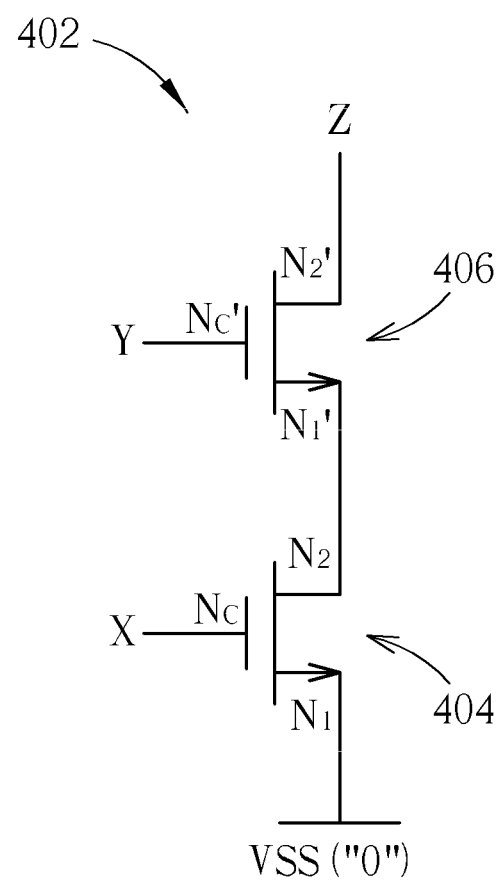
FIG. 5 is a diagram illustrating a second logic circuit implementation according to an exemplary embodiment of the present invention.

FIG. 5 is a diagram illustrating a second logic circuit implementation according to an exemplary embodiment of the present invention. The logic circuit 402 including two N-channel metal-oxide-semiconductor (NMOS) transistors 404 and 406 connected in a series manner. As shown in the figure, the NMOS transistor 404 has a control terminal (i.e., a gate terminal) $N_C$ arranged to receive a first input signal X, a first connection terminal (i.e., a source terminal) $N_1$ coupled to a logic low level "0" (e.g., a low supply voltage/signal ground VSS), and a second connection terminal (i.e., a drain terminal) $N_2$. Regarding the other NMOS transistor 406, it has a control terminal (i.e., a gate terminal) $N_C'$ arranged to receive a second input signal Y, a first connection terminal (i.e., a source terminal) $N_1'$ coupled to the second terminal $N_2$ of the NMOS transistor 404, and a second connection terminal (i.e., a drain terminal) $N_2$ arranged to output an output signal Z. Similarly, the logic circuit 402 can be though as a switch circuit controlled by the input signals presented at the gate terminals of the NMOS transistors 404 and 406. More specifically, the logic circuit 402 makes the output signal Z have the logic low level "0" only when both of the input signals X and Y have a logic high level "1". That is, Z=0 if X=1 and Y=1.

In view of above, the logic circuit 402 may be employed to control the generation of the output signal Z being one of the clock signals I, $I_b$, Q, and $Q_b$ when the input signals X and Y are properly set. Please refer to FIG. 6, which is a table illustrating connection configurations of the logic circuit 402 shown in FIG. 5. For example, when the output signal Z is desired to be the clock signal I shown in FIG. 2, the control terminal $N_c$ of the NMOS transistor 404 may be arranged to receive the clock signal CK shown in FIG. 2, and the control terminal $N_c'$ of the NMOS transistor 406 may be arranged to receive the clock signal $I_b$ shown in FIG. 2. It should be noted that the inputs at the control terminals of the NMOS transistors 404 and 406 are interchangeable. Therefore, in an alternative design, the control terminal $N_c$ of the NMOS transistor 404 may be arranged to receive the clock signal $I_b$ shown in FIG. 2, and the control terminal $N_c'$ of the NMOS transistor 406 may be arranged to receive the clock signal CK shown in FIG. 2. Only some of the possible connection configurations of the logic circuit 402 are included in the table shown in FIG. 6. That is, as long as the spirit of the present invention is obeyed, other connection configurations not included in the table are also feasible.

It should be noted that FIG. 6 simply shows possible options of signals which may be presented at nodes of the logic circuit 402 when the logic circuit 402 is employed in a frequency divider. As the logic circuit 402 is capable of pulling a signal level of the output signal Z to the logic low level "0" each time both of the first input signal X and the second input signal Y have the logic high level "1" and has no capability of pulling the signal level of the output signal Z to the logic high level "1", the logic circuit 402 therefore has to collaborate with other logic circuit(s) also implemented in the frequency divider to make the output signal Z become a clock signal which switches to the logic high level "1" and the logic low level "0" alternately.

Figure 7:
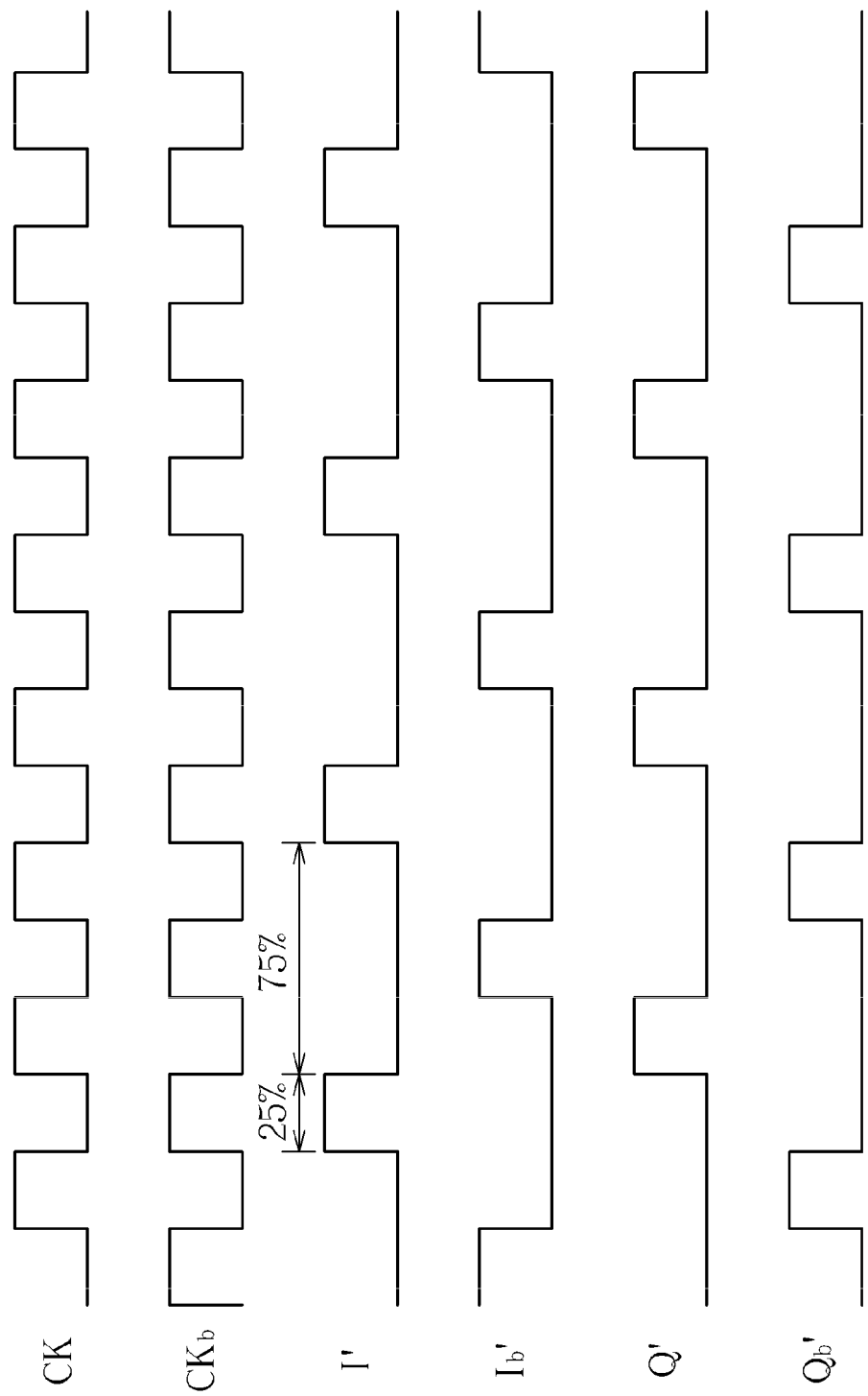
FIG. 7 is a diagram illustrating waveforms of possible input clock signals and output clock signals of a frequency divider according to a second frequency divider design.

FIG. 7 is a diagram illustrating waveforms of possible input clock signals and output clock signals of a frequency divider according to a second frequency divider design. At least one of the clock signals CK and $CK_b$ having a duty cycle substantially equal to 50% may be fed into the exemplary frequency divider 100 to act as the input clock signal, and at least one of the clock signals I', $I_b'$, Q', and $Q_b'$ having a duty cycle substantially equal to 25% may be generated from the exemplary frequency divider 100 to act as the output clock signal supplied to a following signal processing stage (not shown). As shown in FIG. 7, the clock signals CK and $CK_b$ have a 180-degree phase difference therebetween, clock signals I' and $I_b'$ have a 180-degree phase difference therebetween, and clock signals Q' and $Q_b'$ have a 180-degree phase difference therebetween. In addition, the clock signals I' and Q' have a 90-degree phase difference therebetween, and the clock signals $I_b'$ and $Q_b'$ have a 90-degree phase difference therebetween. In the following, several feasible logic circuit implementations are provided, wherein any of the first logic circuit 101, the second logic circuit 102, the third logic circuit 103, and the fourth logic circuit 104 may be realized using one of the exemplary logic circuit implementations.

Figure 8:
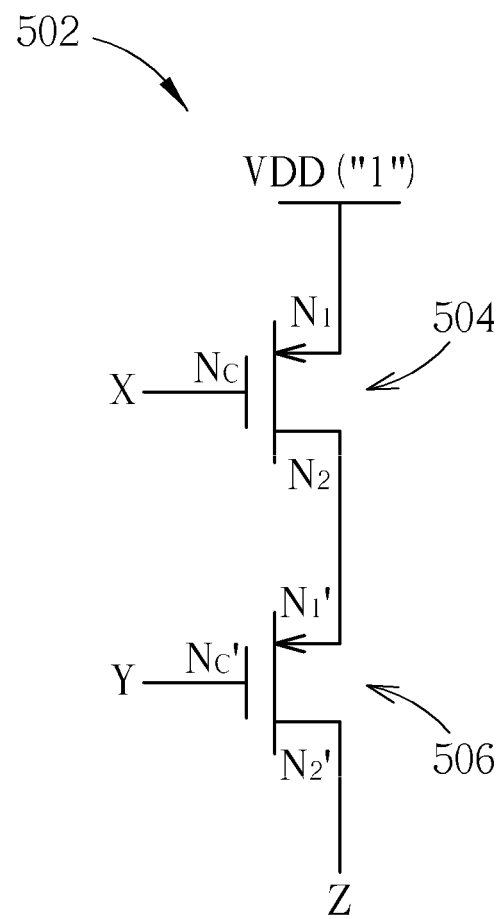
FIG. 8 is a diagram illustrating a third logic circuit implementation according to an exemplary embodiment of the present invention.

FIG. 8 is a diagram illustrating a third logic circuit implementation according to an exemplary embodiment of the present invention. The logic circuit 502 including two PMOS transistors 504 and 506 connected in a series manner. As shown in the figure, the PMOS transistor 504 has a control terminal (i.e., a gate terminal) $N_C$ arranged to receive a first input signal X, a first connection terminal (i.e., a source terminal) $N_1$ coupled to a logic high level "1" (e.g., a high supply voltage/supplied power voltage VDD), and a second connection terminal (i.e., a drain terminal) $N_2$. Regarding the other PMOS transistor 506, it has a control terminal (i.e., a gate terminal) $N_C'$ arranged to receive a second input signal Y, a first connection terminal (i.e., a source terminal) $N_1'$ coupled to the second terminal $N_2$ of the PMOS transistor 504, and a second connection terminal (i.e., a drain terminal) $N_2$ arranged to output an output signal Z. The logic circuit 502 can be though as a switch circuit controlled by the input signals presented at the gate terminals of the PMOS transistors 504 and 506. More specifically, the logic circuit 502 makes the output signal Z have the logic high level "1" only when both of the input signals X and Y have a logic low level "0" (e.g., a low supply voltage/signal ground VSS). That is, Z=1 if X=0 and Y=0.

In view of above, the logic circuit 502 may be employed to control the generation of the output signal Z being as one of the clock signals I', $I_b'$, Q', and $Q_b'$ when the input signals X and Y are properly set. Please refer to FIG. 9, which is a table illustrating connection configurations of the logic circuit 502 shown in FIG. 8. For example, when the output signal Z is desired to be the clock signal I' shown in FIG. 7, the control terminal $N_c$ of the PMOS transistor 504 may be arranged to receive the clock signal CK shown in FIG. 7, and the control terminal $N_c'$ of the PMOS transistor 506 may be arranged to receive the clock signal $I_b'$ shown in FIG. 7. It should be noted that the inputs at the control terminals of the PMOS transistors 504 and 506 are interchangeable. Therefore, in an alternative design, the control terminal $N_c$ of the PMOS transistor 504 may be arranged to receive the clock signal $I_b'$ shown in FIG. 7, and the control terminal $N_c'$ of the PMOS transistor 506 may be arranged to receive the clock signal CK shown in FIG. 7. Only some of the possible connection configurations of the logic circuit 502 are included in the table shown in FIG. 9. That is, as long as the spirit of the present invention is obeyed, other connection configurations not included in the table are also feasible.

It should be noted that FIG. 9 simply shows possible options of signals which may be presented at nodes of the logic circuit 502 when the logic circuit 502 is employed in a frequency divider. As the logic circuit 502 is capable of pulling a signal level of the output signal Z to the logic high level "1" each time both of the first input signal X and the second input signal Y have the logic low level "0" and has no capability of pulling the signal level of the output signal Z to the logic low level "0", the logic circuit 502 therefore has to collaborate with other logic circuit(s) also implemented in the frequency divider to make the output signal Z become a clock signal which switches to the logic high level "1" and the logic low level "0" alternately.

Figure 10:
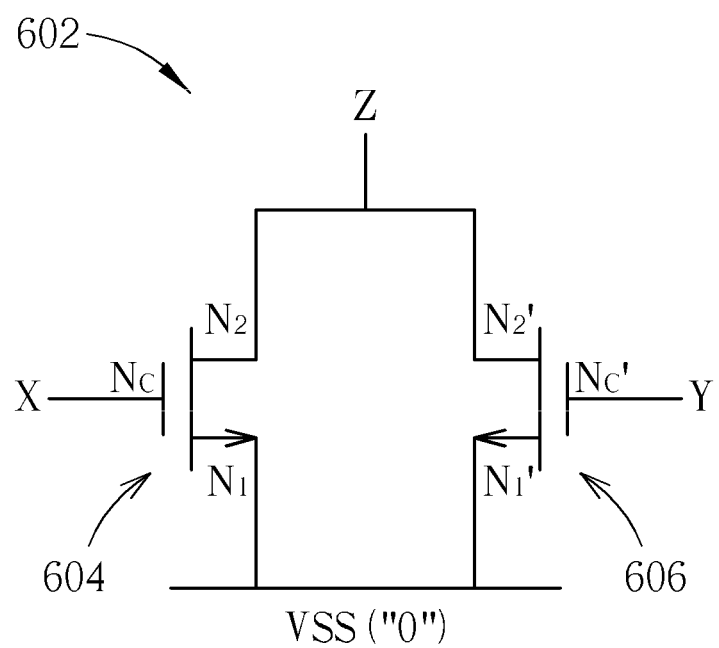
FIG. 10 is a diagram illustrating a fourth logic circuit implementation according to an exemplary embodiment of the present invention.
Figure 12:
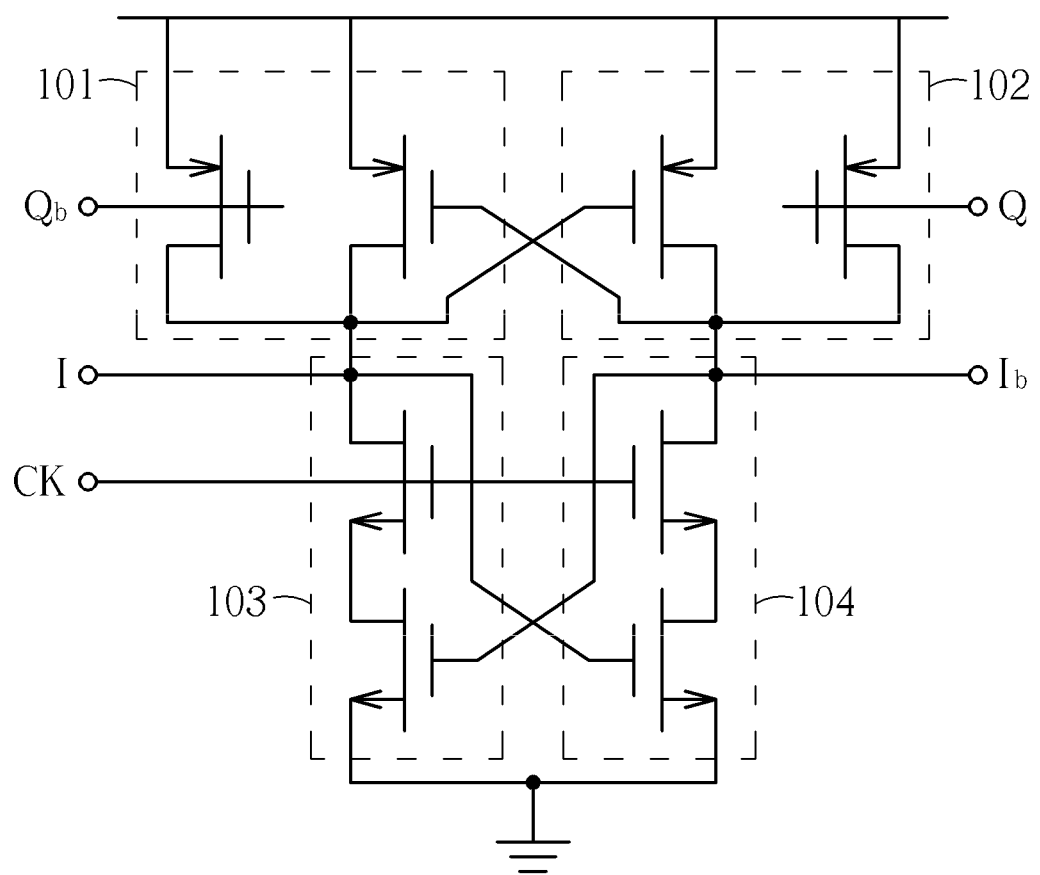
FIG. 12 is a diagram illustrating a first exemplary implementation of the frequency divider in FIG. 1 that is arranged for generating output clock signal(s) having the duty cycle substantially equal to 75%.
Figure 13:
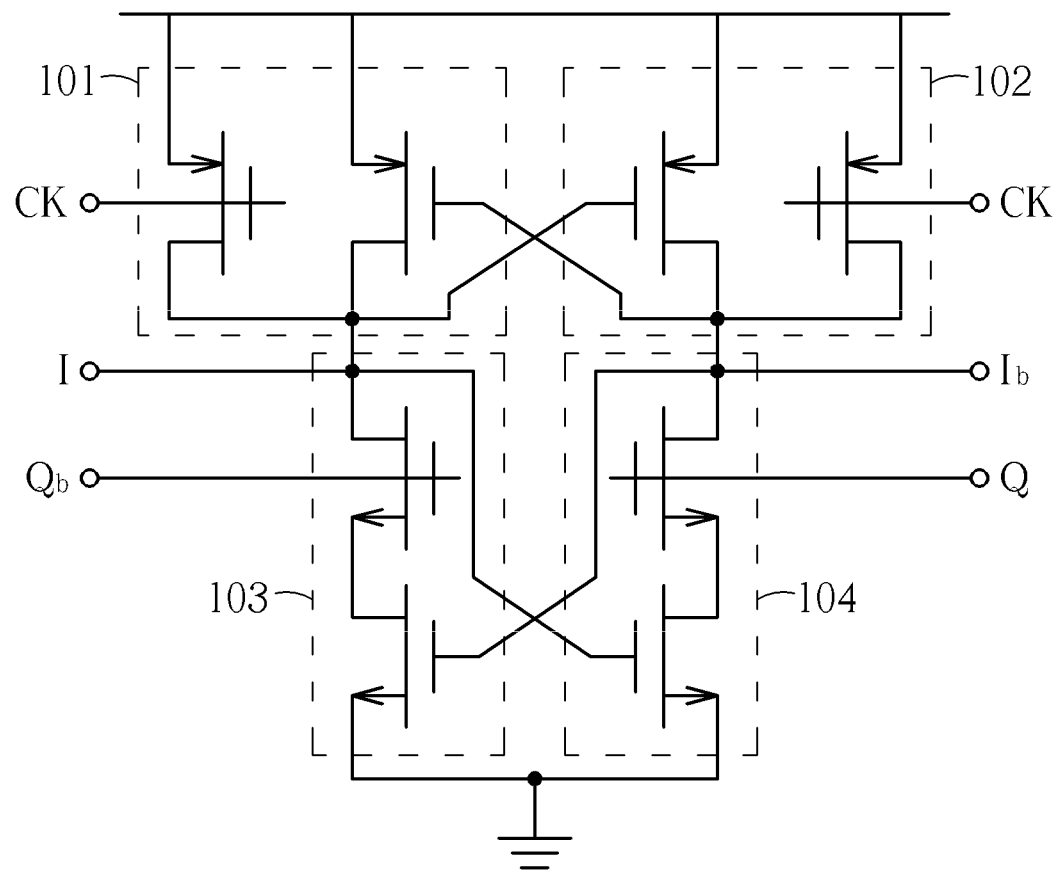
FIG. 13 is a diagram illustrating a second exemplary implementation of the frequency divider in FIG. 1 that is arranged for generating output clock signal(s) having the duty cycle substantially equal to 75%.
Figure 14:
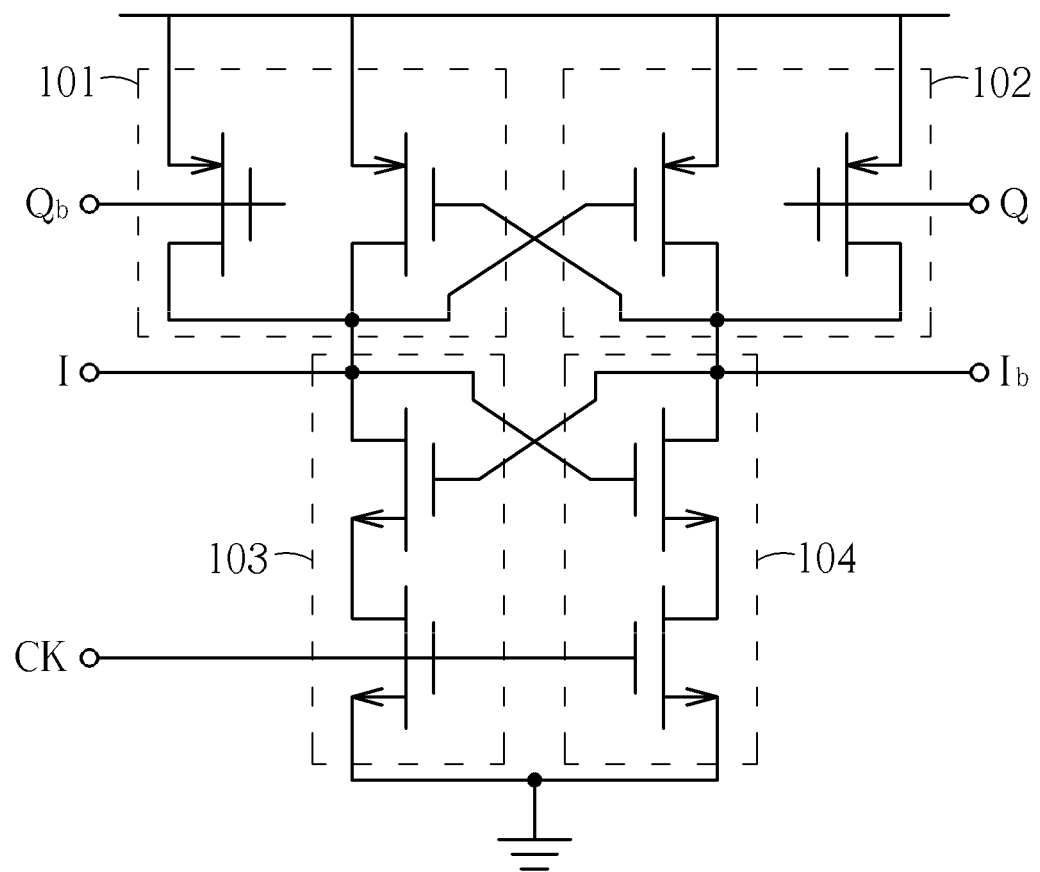
FIG. 14 is a diagram illustrating a third exemplary implementation of the frequency divider in FIG. 1 that is arranged for generating output clock signal(s) having the duty cycle substantially equal to 75%.
Figure 15:
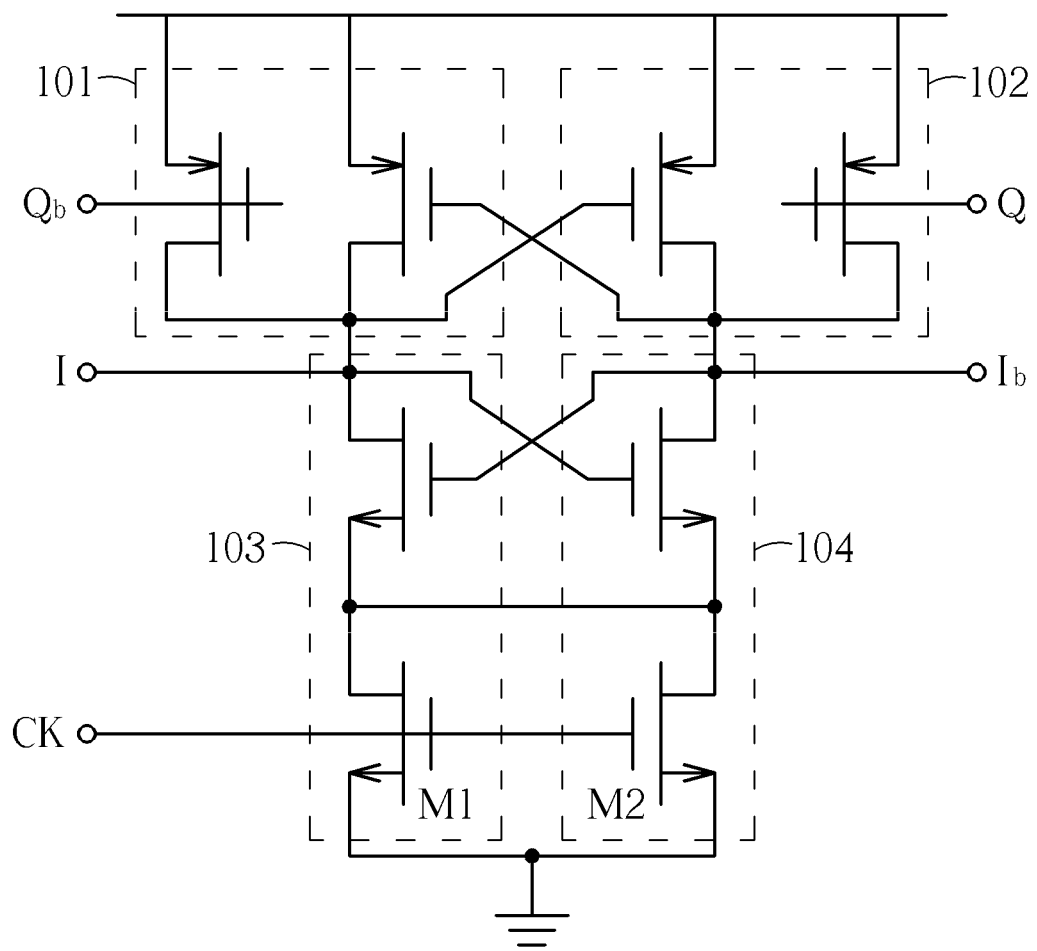
FIG. 15 is a diagrams illustrating a fourth exemplary implementation of the frequency divider in FIG. 1 that is arranged for generating output clock signal(s) having the duty cycle substantially equal to 75%.
Figure 16:
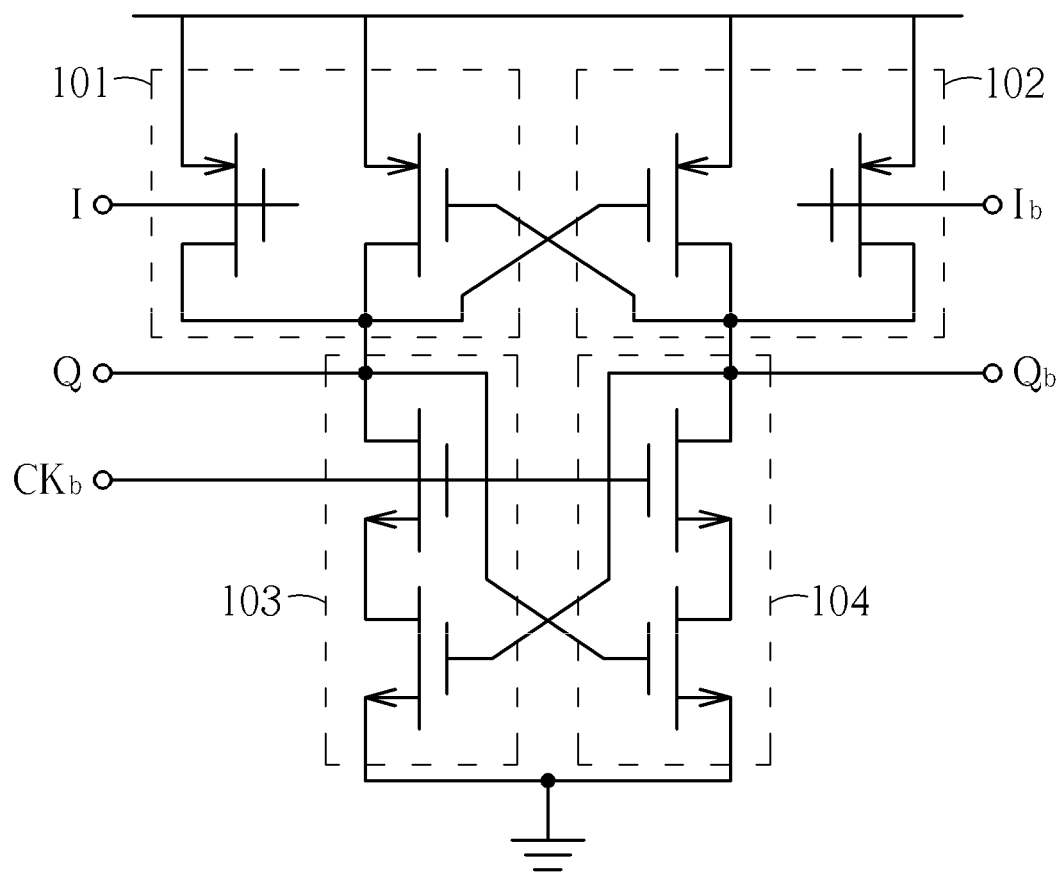
FIG. 16 is a diagram illustrating a fifth exemplary implementation of the frequency divider in FIG. 1 that is arranged for generating output clock signal(s) having the duty cycle substantially equal to 75%.
Figure 17:
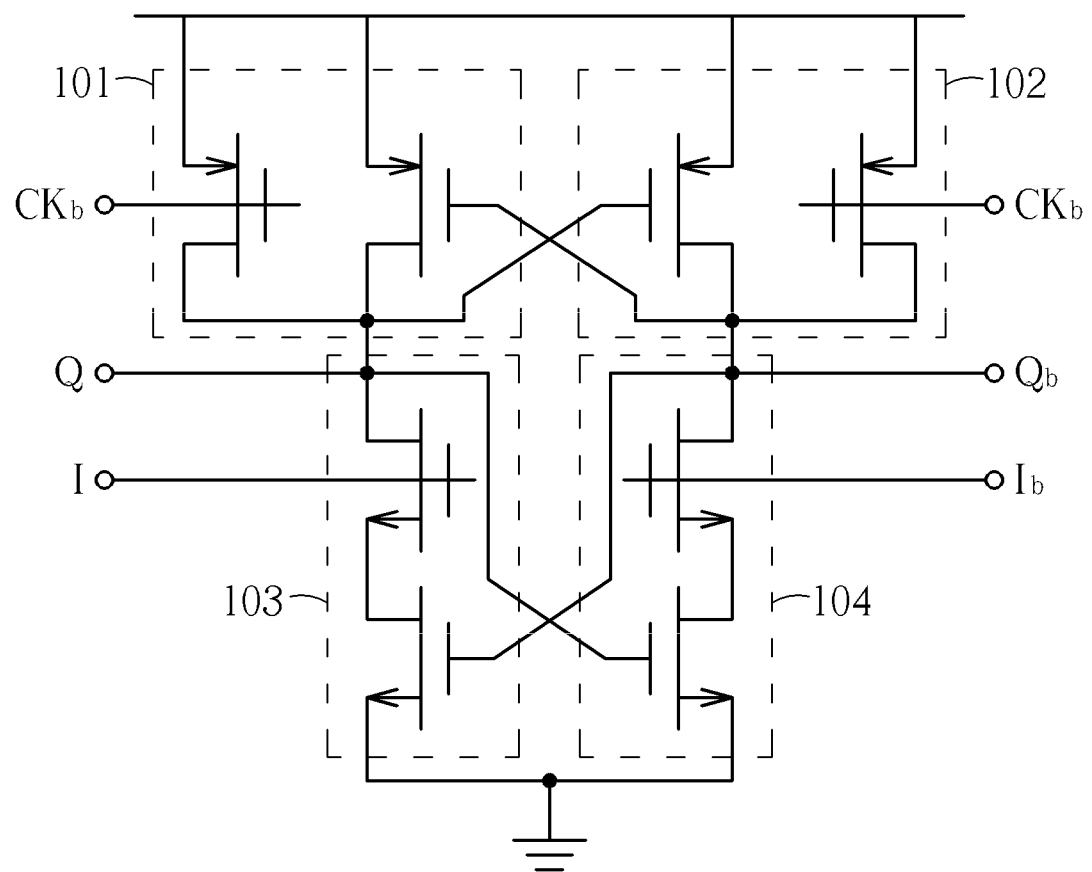
FIG. 17 is a diagram illustrating a sixth exemplary implementation of the frequency divider in FIG. 1 that is arranged for generating output clock signal(s) having the duty cycle substantially equal to 75%.
Figure 18:
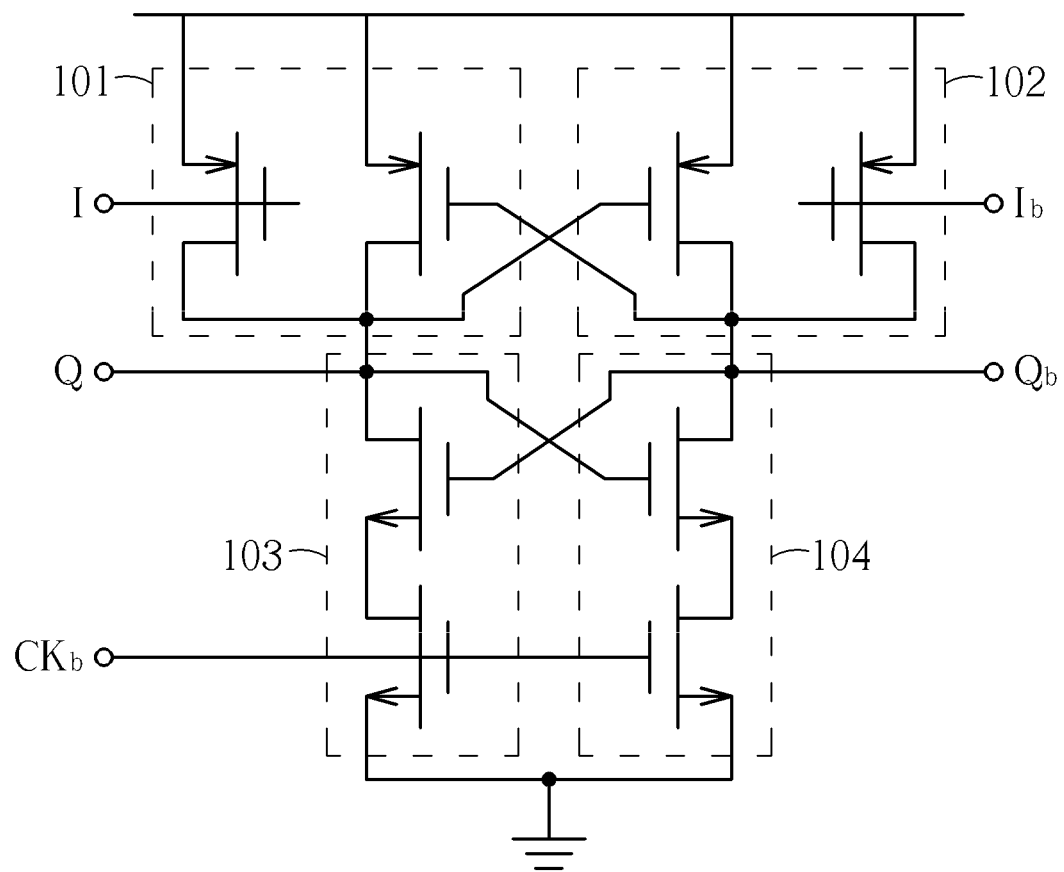
FIG. 18 is a diagram illustrating a seventh exemplary implementation of the frequency divider in FIG. 1 that is arranged for generating output clock signal(s) having the duty cycle substantially equal to 75%.
Figure 19:
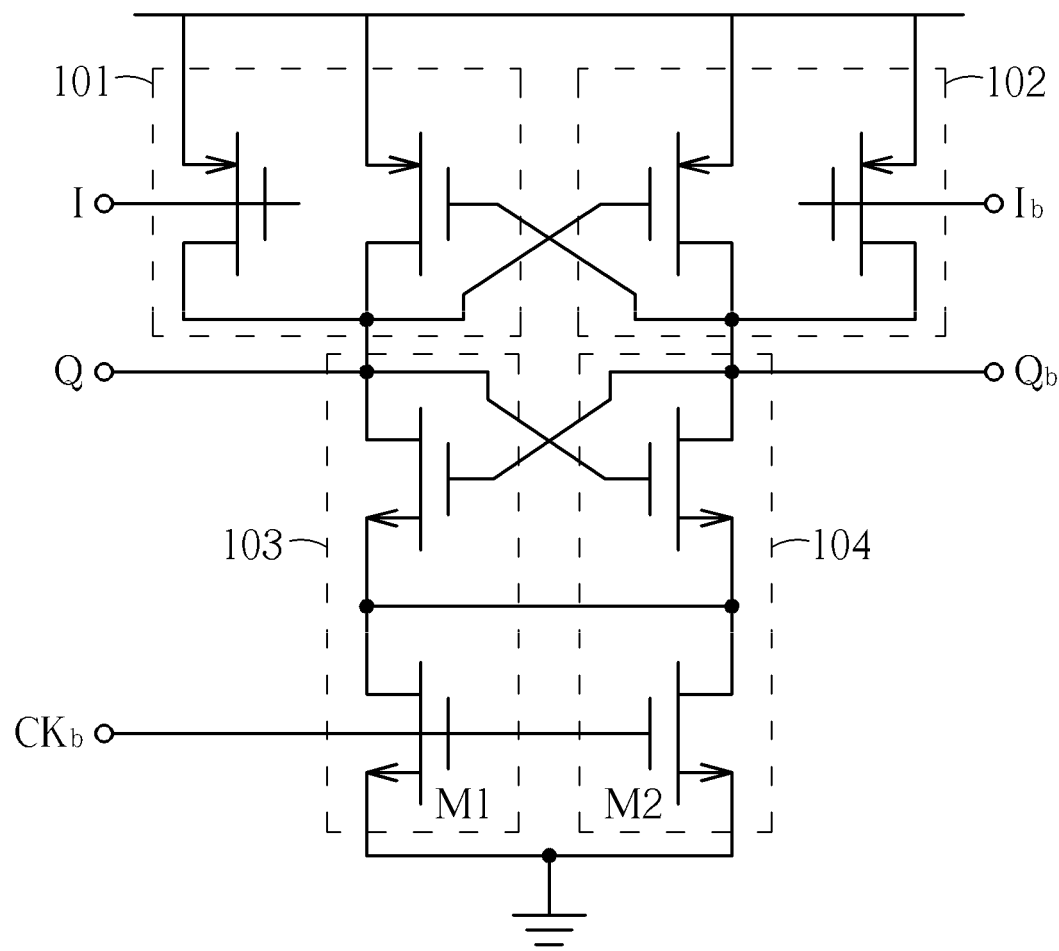
FIG. 19 is a diagram illustrating an eighth exemplary implementation of the frequency divider in FIG. 1 that is arranged for generating output clock signal(s) having the duty cycle substantially equal to 75%.

FIG. 10 is a diagram illustrating a fourth logic circuit implementation according to an exemplary embodiment of the present invention. The logic circuit 602 including two NMOS transistors 604 and 606 connected in a parallel manner. As shown in the figure, the NMOS transistor 604 has a control terminal (i.e., a gate terminal) $N_C$ arranged to receive a first input signal X, a first connection terminal (i.e., a source terminal) $N_1$ coupled to a logic low level "0" (e.g., a low supply voltage/signal ground VSS), and a second connection terminal (i.e., a drain terminal) $N_2$ arranged to output the output signal Z. Regarding the other NMOS transistor 606, it has a control terminal (i.e., a gate terminal) $N_C'$ arranged to receive a second input signal Y, a first connection terminal (i.e., a source terminal) $N_1'$ coupled to the logic low level "0", and a second connection terminal (i.e., a drain terminal) $N_2$ arranged to output the output signal Z. The logic circuit 602 can be though as a switch circuit controlled by the input signals presented at the gate terminals of the NMOS transistors 604 and 606. More specifically, the logic circuit 602 makes the output signal Z have the logic low level "0" when at least one of the input signals X and Y has a logic high level "1". That is, Z=0 if X=1 or Y=1.

In view of above, the logic circuit 602 may be employed to control the generation of the output signal Z being one of the clock signals I', $I_b'$, and $Q_b'$ when the input signals X and Y are properly set. Please refer to FIG. 11, which is a table illustrating connection configurations of the logic circuit 602 shown in FIG. 10. For example, when the output signal Z is desired to be the clock signal I' shown in FIG. 7, the control terminal $N_c$ of the NMOS transistor 604 may be arranged to receive the clock signal $I_b'$ shown in FIG. 7, and the control terminal $N_c'$ of the NMOS transistor 606 may be arranged to receive the clock signal Q' shown in FIG. 7. It should be noted that the inputs at the control terminals of the NMOS transistors 604 and 606 are interchangeable. Therefore, in an alternative design, the control terminal $N_c$ of the NMOS transistor 604 may be arranged to receive the clock signal Q' shown in FIG. 7, and the control terminal $N_c'$ of the NMOS transistor 606 may be arranged to receive the clock signal $I_b'$ shown in FIG. 7. Only some of the possible connection configurations of the logic circuit 602 are included in the table shown in FIG. 11. That is, as long as the spirit of the present invention is obeyed, other connection configurations not included in the table are also feasible.

It should be noted that FIG. 11 simply shows possible options of signals which may be presented at nodes of the logic circuit 602 when the logic circuit 602 is employed in a frequency divider. As the logic circuit 602 is capable of pulling a signal level of the output signal Z to the logic low level "0" each time one of the first input signal X and the second input signal Y has the logic high level "1" and has no capability of pulling the signal level of the output signal Z to the logic high level "1", the logic circuit 602 therefore has to collaborate with other logic circuit(s) also implemented in the frequency divider to make the output signal Z become a clock signal which switches to the logic high level "1" and the logic low level "0" alternately.

The frequency divider 100 shown in FIG. 1 may be implemented using a combination of the logic circuits 302, 402, 502, and 602. More specifically, each of the first logic circuit 101, the second logic circuit 102, the third logic circuit 103, and the fourth logic circuit 104 may be realized using one logic circuit selected from the logic circuits 302, 402, 502, and 602, where the inputs at the control terminals of transistors in the selected logic circuit should be properly configured according to actual design requirement.

By way of example, but not limitation, each of the first logic circuit 101 and the second logic circuit 102 may be implemented using the logic circuit 302 shown in FIG. 3, and each of the third logic circuit 103 and the fourth logic circuit 104 may be implemented using the logic circuit 402 shown in FIG. 5. FIG. 12-FIG. 19 are diagrams illustrating exemplary implementations of the frequency divider 100 in FIG. 1 that is arranged for generating output clock signal(s) having the duty cycle substantially equal to 75%. In a case where the following signal processing stage requires a clock signal with a duty cycle substantially equal to 25%, an inverter may be employed to convert the frequency divider output with the duty cycle substantially equal to 75% into a desired clock signal with a duty cycle substantially equal to 25%. Please note that the exemplary frequency divider implementations shown in FIG. 15 and FIG. 19 have NMOS transistors M1 and M2 with control terminals (i.e., gate terminals) arranged to receive the same input clock signal CK/$CK_b$. Therefore, the connection terminals (i.e., drain terminals) of the NMOS transistors M1 and M2 can be coupled to each other for acting as a common-mode terminal driven/controlled by the input clock signal CK/$CK_b$. The same objective of generating an output clock signal with a duty cycle different from input clock signal's duty cycle is achieved. As a person skilled in the art can readily understand operations of these exemplary frequency divider implementations after reading above paragraphs directed to the logic circuits 302 and 402, further description is omitted here for brevity.

In an alternative design, each of the first logic circuit 101 and the second logic circuit 102 may be implemented using the logic circuit 502 shown in FIG. 8, and each of the third logic circuit 103 and the fourth logic circuit 104 may be implemented using the logic circuit 602 shown in FIG. 10. FIG. 20-FIG. 27 are diagrams illustrating exemplary implementations of the frequency divider 100 in FIG. 1 that is arranged for generating output clock signal(s) having the duty cycle substantially equal to 25%. Please note that the exemplary frequency divider implementations shown in FIG. 23 and FIG. 27 have PMOS transistors M3 and M4 with control terminals (i.e., gate terminals) arranged to receive the same input clock signal CK/CK$_b$. Therefore, the connection terminals (i.e., drain terminals) of the PMOS transistors M3 and M4 can be coupled to each other for acting as a common-mode terminal driven/controlled by the input clock signal CK/CK$_b$. The same objective of generating an output clock signal with a duty cycle different from input clock signal's duty cycle is achieved. As a person skilled in the art can readily understand operations of these exemplary frequency divider implementations after reading above paragraphs directed to the logic circuits 502 and 602, further description is omitted here for brevity.

Regarding the second clock signal CLK_2, the fourth clock signal CLK_4, the fifth clock signal CLK_5, and the sixth clock signal CLK_6 of the frequency divider 100 shown in FIG. 1, at least one clock signal is an input clock signal with a first duty cycle (e.g., a duty cycle substantially equal to 50%), and the remaining clock signals have a second duty cycle (e.g., a duty cycle substantially equal to 25% or 75%) different from the first duty cycle. The remaining clock signals with the second duty cycle may be provided from any clock source, thereby making the frequency divider 100 generate the first clock signal CLK_1 and the third clock signal CLK_3 with the second duty cycle. For example, at least one of the remaining clock signals with the second duty cycle may be provided by a conventional frequency divider, for example, using the clock-gating technique, or provided by another frequency dividing circuit using the same frequency divider architecture shown in FIG. 1. That is, any frequency design employing the frequency divider architecture shown in FIG. 1 obeys the spirit of the present invention and falls within the scope of the present invention.

Figure 28:
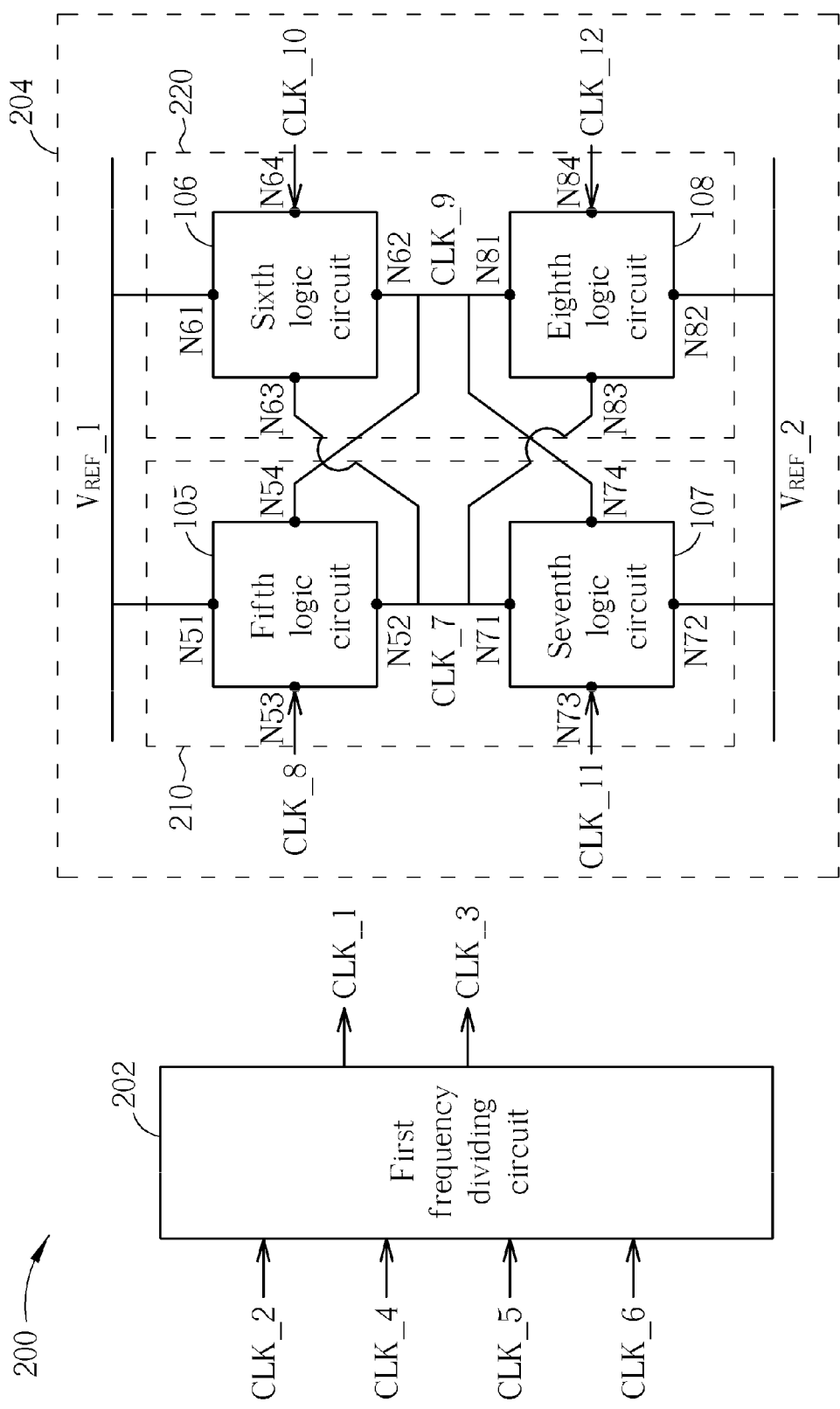
FIG. 28 is a diagram illustrating a frequency divider according to a second exemplary embodiment of the present invention.

Consider a case where at least one of the remaining clock signals with the second duty cycle is generated by another frequency dividing circuit using the same frequency divider architecture shown in FIG. 1. FIG. 28 shows a frequency divider according to a second exemplary embodiment of the present invention. The exemplary frequency divider 200 includes a first frequency dividing circuit 202 and a second frequency dividing circuit 204, wherein the first frequency dividing circuit 202 is implemented using the frequency divider 100 shown in FIG. 1. In this exemplary embodiment, the first frequency dividing circuit 202 is arranged for processing the above-mentioned first input clock signal with the first duty cycle, and the second frequency dividing circuit 204 is arranged for processing a second input clock signal with the first duty cycle, wherein the first input clock signal and the second input clock signal have a 180-degree phase difference therebetween. For example, one of the first input clock signal and the second input clock signal is the clock signal CK shown in FIG. 2/FIG. 7, and the other of the first input clock signal and the second input clock signal is the clock signal CK$_b$ shown in FIG. 2/FIG. 7.

The second frequency dividing circuit 204 of the frequency divider 200 includes a plurality of logic circuit blocks, such as a third logic circuit block 210 and a fourth logic circuit block 220. The logic circuit blocks of the second frequency dividing circuit 204 are realized using a plurality of logic circuits including a fifth logic circuit 105, a sixth logic circuit 106, a seventh logic circuit 107, and an eighth logic circuit 108. As can be seen from FIG. 28, the third logic circuit block 210 of this exemplary embodiment includes the fifth logic circuit 105 and the seventh logic circuit 107, and the fourth logic circuit block 220 includes the sixth logic circuit 106 and the eighth logic circuit 108. The fifth logic circuit 105 has a first node N51 arranged to receive the first reference voltage V$_{REF\_1}$, a second node N52 arranged to output a seventh clock signal CLK_7, a third node N53 arranged to receive an eighth clock signal CLK_8, and a fourth node N54 arranged to receive a ninth clock signal CLK_9. The fifth logic circuit 105 is arranged to control the seventh clock signal CLK_7 according to the first reference voltage V$_{REF\_1}$, the eighth clock signal CLK_8, and the ninth clock signal CLK_9. Regarding the sixth logic circuit 106, it has a first node N61 arranged to receive the first reference voltage V$_{REF\_1}$, a second node N62 arranged to output the ninth clock signal CLK_9, a third node N63 arranged to receive the seventh clock signal CLK_7, and a fourth node N64 arranged to receive an tenth clock signal CLK_10. The sixth logic circuit 106 is arranged to control the ninth clock signal CLK_9 according to the first reference voltage V$_{REF\_1}$, the seventh clock signal CLK_7, and the tenth clock signal CLK_10. The seventh logic circuit 107 has a first node N71 coupled to the second node N52 of the fifth logic circuit 105 and arranged to output the seventh clock signal CLK_7, a second node N72 arranged to receive the second reference voltage V$_{REF\_2}$, a third node N73 arranged to receive an eleventh clock signal CLK_11, and a fourth node N74 arranged to receive the ninth clock signal CLK_9. The seventh logic circuit 107 is arranged to control the seventh clock signal CLK_7 according to the second reference voltage V$_{REF\_2}$, the eleventh clock signal CLK_11, and the ninth clock signal CLK_9. The eighth logic circuit 108 has a first node N81 coupled to the second node N62 of the sixth logic circuit 106 and arranged to output the ninth clock signal CLK_9, a second node N82 arranged to receive the second reference voltage V$_{REF\_2}$, a third node N83 arranged to receive the seventh clock signal CLK_7, and a fourth node N84 arranged to receive a twelfth clock signal CLK_12. The eighth logic circuit 108 is arranged to control the ninth clock signal CLK_9 according to the second reference voltage V$_{REF\_2}$, the seventh clock signal CLK_7, and the twelfth clock signal CLK_12. It should be noted that at least one clock signal of the eighth clock signal CLK_8, the tenth clock signal CLK_10, the eleventh clock signal CLK_11, and the twelfth clock signal CLK_12 is the second input clock signal, and all of the seventh clock signal CLK_7, the eighth clock signal CLK_8, the ninth clock signal CLK_9, the tenth clock signal CLK_10, the eleventh clock signal CLK_11, and the twelfth clock signal CLK_12, except the at least one clock signal being the second input clock signal, have the second duty cycle. Moreover, all of the second clock signal CLK_2, the fourth clock signal CLK_4, the fifth clock signal CLK_5, and the sixth clock signal CLK_6, except the at least one clock signal being the first input clock signal, include at least one clock signal being either the seventh clock signal CLK_7 or the ninth clock signal CLK_9.

Regarding the eighth clock signal CLK_8, the tenth clock signal CLK_10, the eleventh clock signal CLK_11, and the twelfth clock signal CLK_12 of the second frequency dividing circuit 204 shown in FIG. 28, at least one clock signal is the second input clock signal with the first duty cycle (e.g., a duty cycle substantially equal to 50%), and the remaining clock signals have the second duty cycle (e.g., a duty cycle substantially equal to 25% or 75%). The remaining clock signals with the second duty cycle may be provided from any clock source. For example, the first frequency dividing circuit 202 shown in FIG. 28 may be configured to provide at least one of the remaining clock signals needed by the second frequency dividing circuit 204. That is, all of the eighth clock signal CLK_8, the tenth clock signal CLK_10, the eleventh clock signal CLK_11, and the twelfth clock signal CLK_12, except the at least one clock signal being the second input clock signal, include at least one clock signal being either the first clock signal CLK_1 or the third clock signal CLK_3.

Similarly, the second frequency dividing circuit 204 of the frequency divider 200 may be implemented using a combination of the aforementioned logic circuits 302, 402, 502, and 602. More specifically, each of the fifth logic circuit 105, the sixth logic circuit 106, the seventh logic circuit 107, and the eighth logic circuit 108 may be realized using one logic circuit selected from the logic circuits 302, 402, 502, and 602. Thus, the first frequency dividing circuit 202 may be implemented using one of the circuits shown in FIG. 12-FIG. 15, and the second frequency dividing circuit 204 may be implemented using one of the circuits shown in FIG. 16-FIG. 19. Alternatively, the first frequency dividing circuit 202 may be implemented using one of the circuits shown in FIG. 20-FIG. 23, and the second frequency dividing circuit 204 may be implemented using one of the circuits shown in FIG. 24-FIG. 27. Regarding a first exemplary frequency divider design, one of the first frequency dividing circuit 202 and the second frequency dividing circuit 204 may be realized by the exemplary frequency divider implementation shown in FIG. 12, and the other of the first frequency dividing circuit 202 and the second frequency dividing circuit 204 may be realized by the exemplary frequency divider implementation shown in FIG. 16. Regarding a second exemplary frequency divider design, one of the first frequency dividing circuit 202 and the second frequency dividing circuit 204 may be realized by the exemplary frequency divider implementation shown in FIG. 13, and the other of the first frequency dividing circuit 202 and the second frequency dividing circuit 204 may be realized by the exemplary frequency divider implementation shown in FIG. 17. Regarding a third exemplary frequency divider design, one of the first frequency dividing circuit 202 and the second frequency dividing circuit 204 may be realized by the exemplary frequency divider implementation shown in FIG. 14 or FIG. 15, and the other of the first frequency dividing circuit 202 and the second frequency dividing circuit 204 may be realized by the exemplary frequency divider implementation shown in FIG. 18 or FIG. 19.

Figure 20:
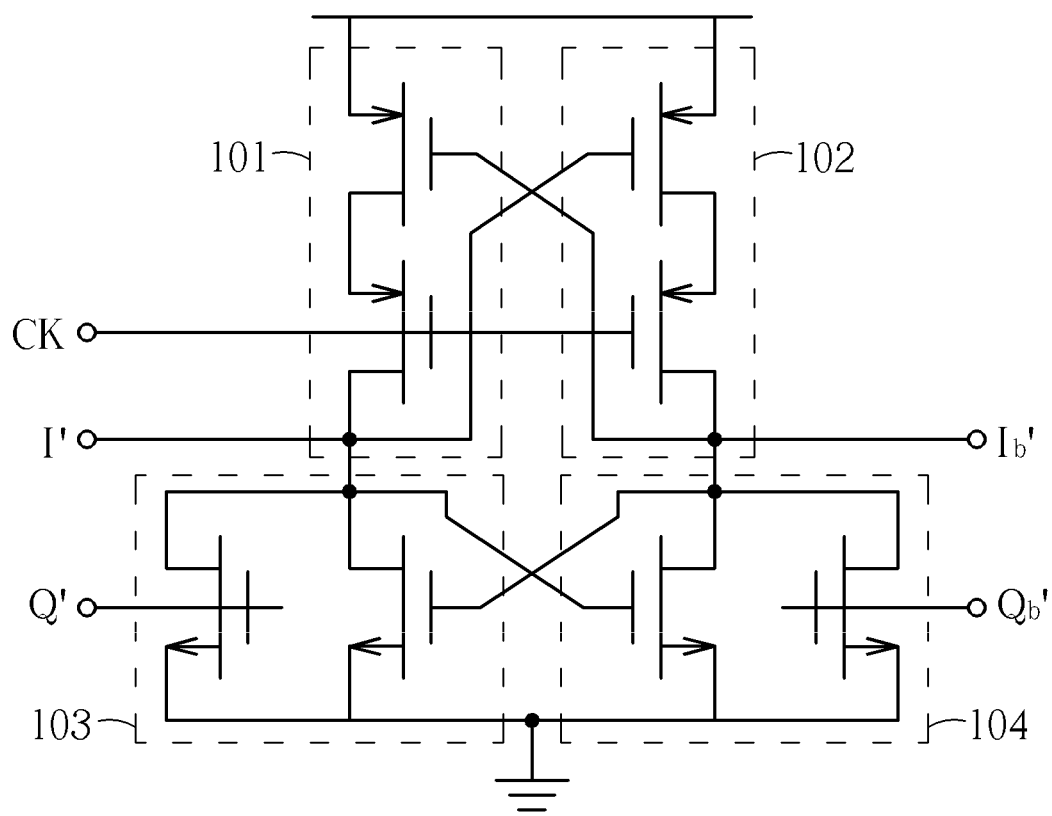
FIG. 20 is a diagram illustrating a first exemplary implementation of the frequency divider in FIG. 1 that is arranged for generating output clock signal(s) having the duty cycle substantially equal to 25%.
Figure 21:
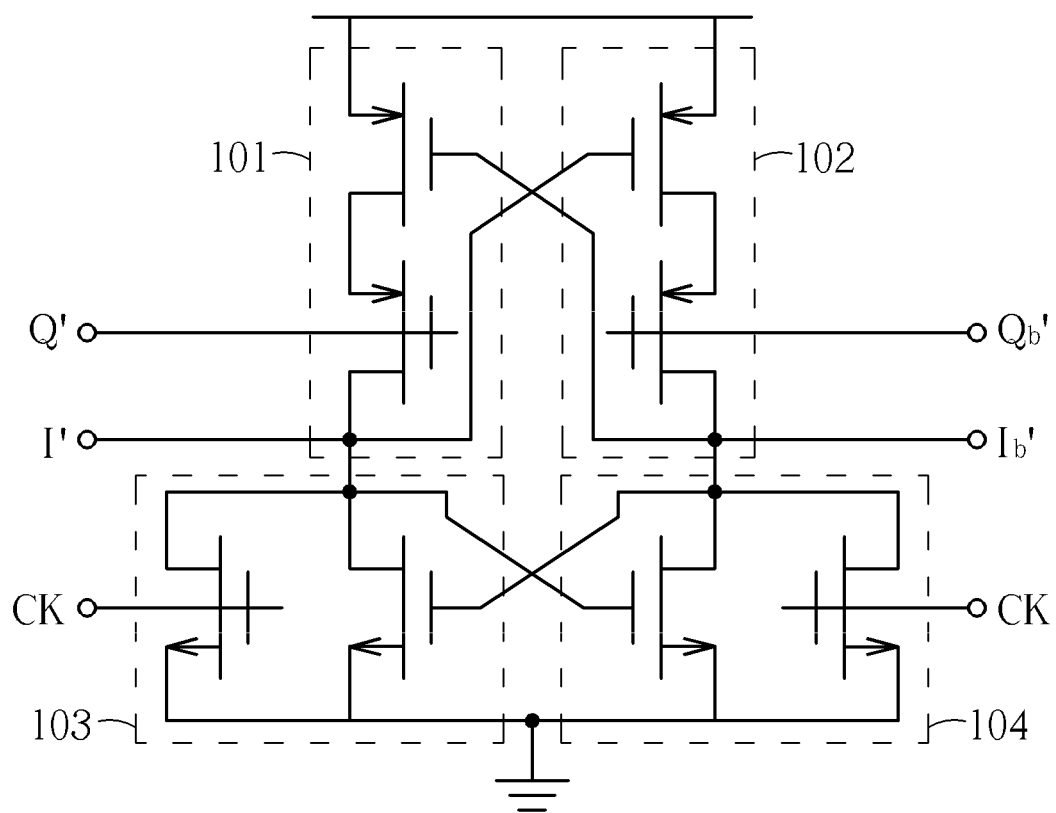
FIG. 21 is a diagram illustrating a second exemplary implementation of the frequency divider in FIG. 1 that is arranged for generating output clock signal(s) having the duty cycle substantially equal to 25%.
Figure 22:
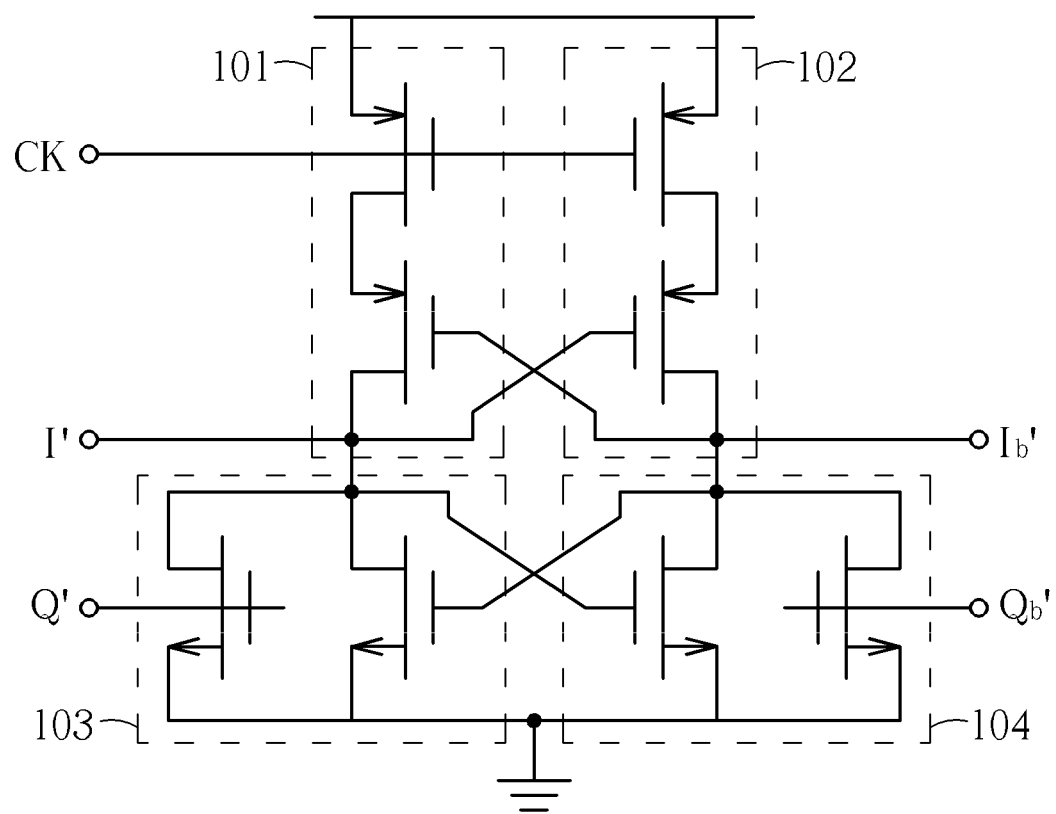
FIG. 22 is a diagram illustrating a third exemplary implementation of the frequency divider in FIG. 1 that is arranged for generating output clock signal(s) having the duty cycle substantially equal to 25%.
Figure 23:
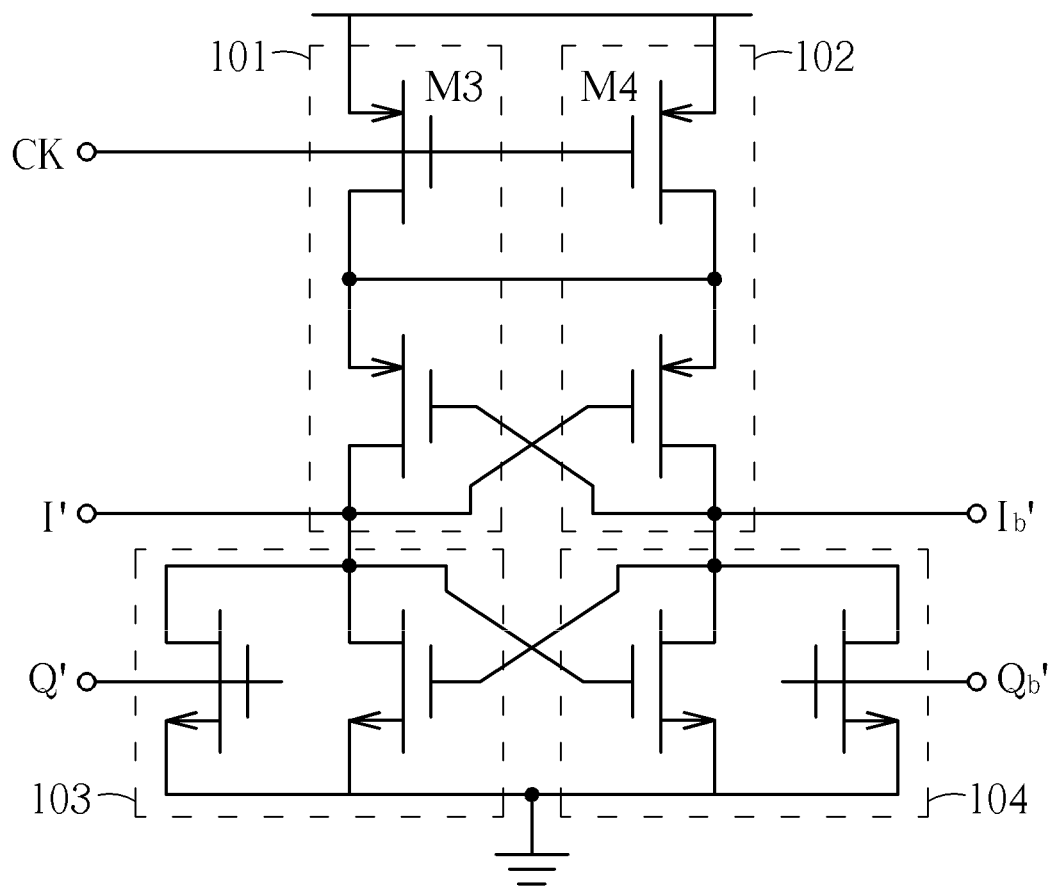
FIG. 23 is a diagram illustrating a fourth exemplary implementation of the frequency divider in FIG. 1 that is arranged for generating output clock signal(s) having the duty cycle substantially equal to 25%.
Figure 24:
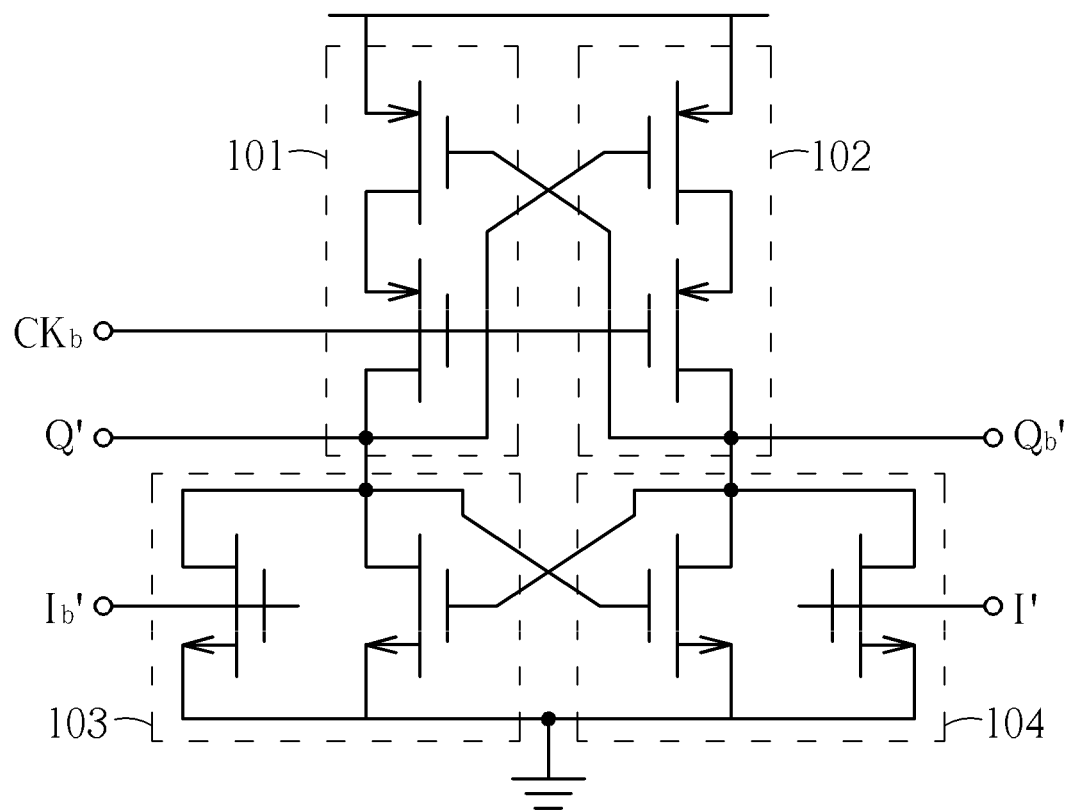
FIG. 24 is a diagram illustrating a fifth exemplary implementation of the frequency divider in FIG. 1 that is arranged for generating output clock signal(s) having the duty cycle substantially equal to 25%.
Figure 25:
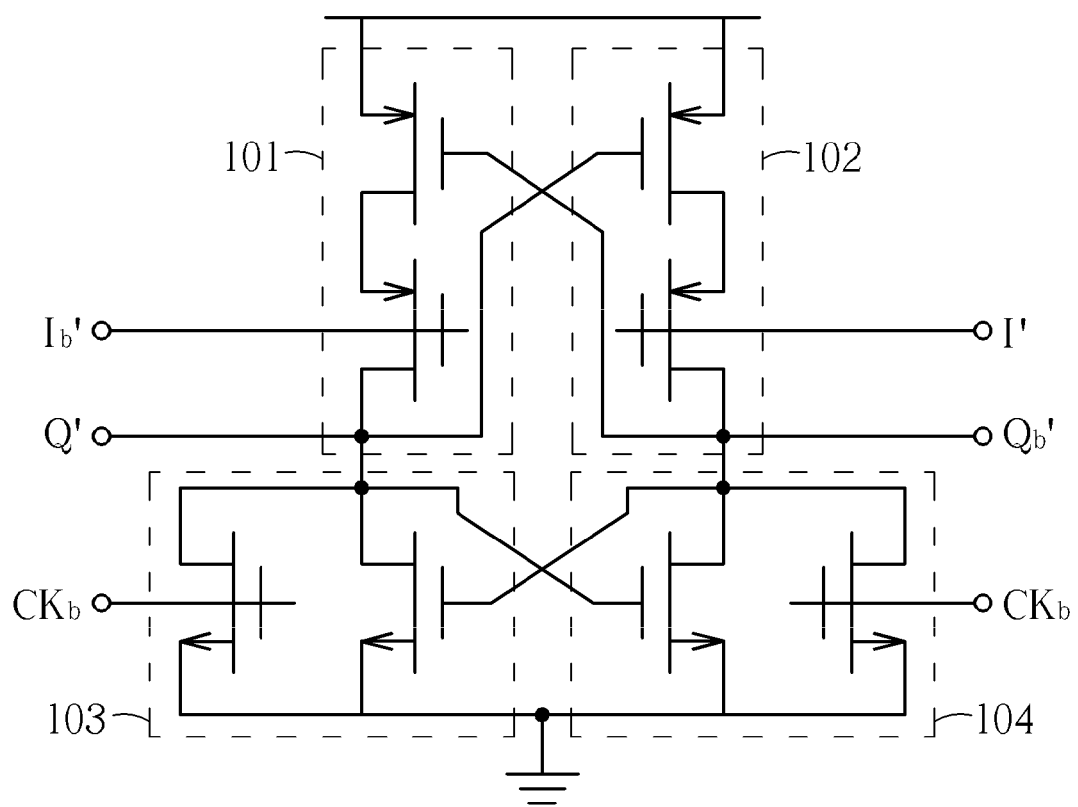
FIG. 25 is a diagram illustrating a sixth exemplary implementation of the frequency divider in FIG. 1 that is arranged for generating output clock signal(s) having the duty cycle substantially equal to 25%.
Figure 26:
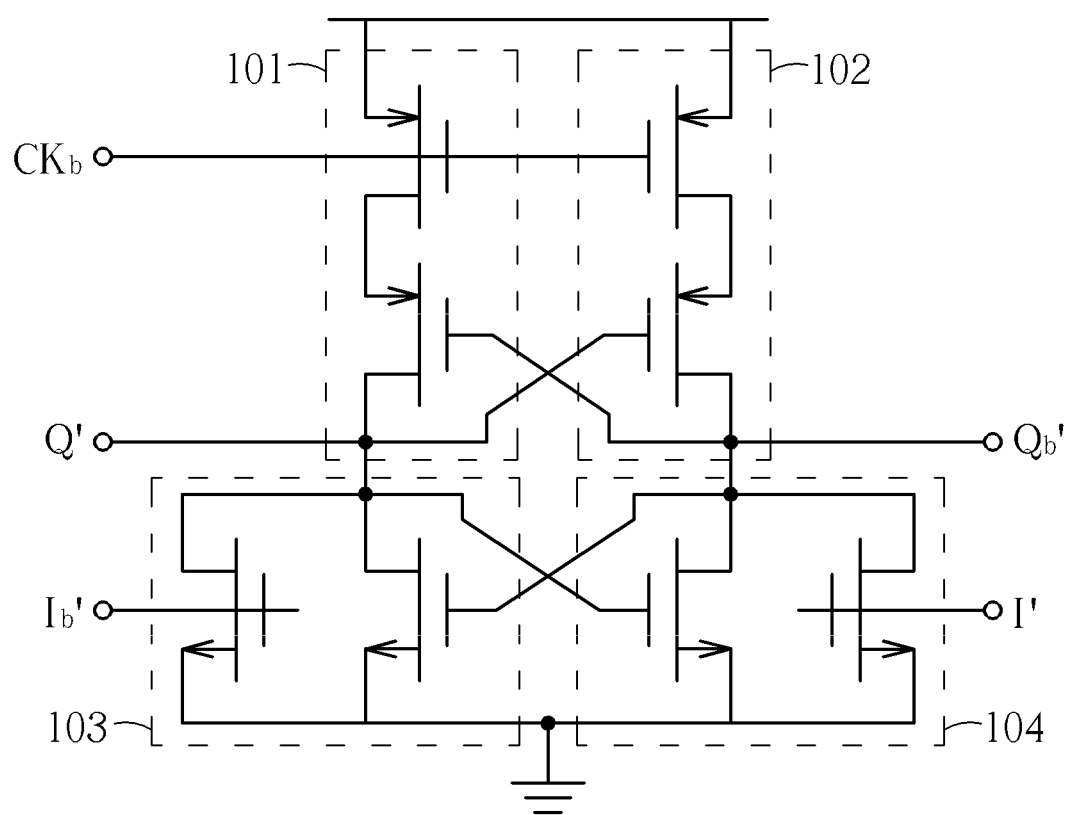
FIG. 26 is a diagram illustrating a seventh exemplary implementation of the frequency divider in FIG. 1 that is arranged for generating output clock signal(s) having the duty cycle substantially equal to 25%.
Figure 27:
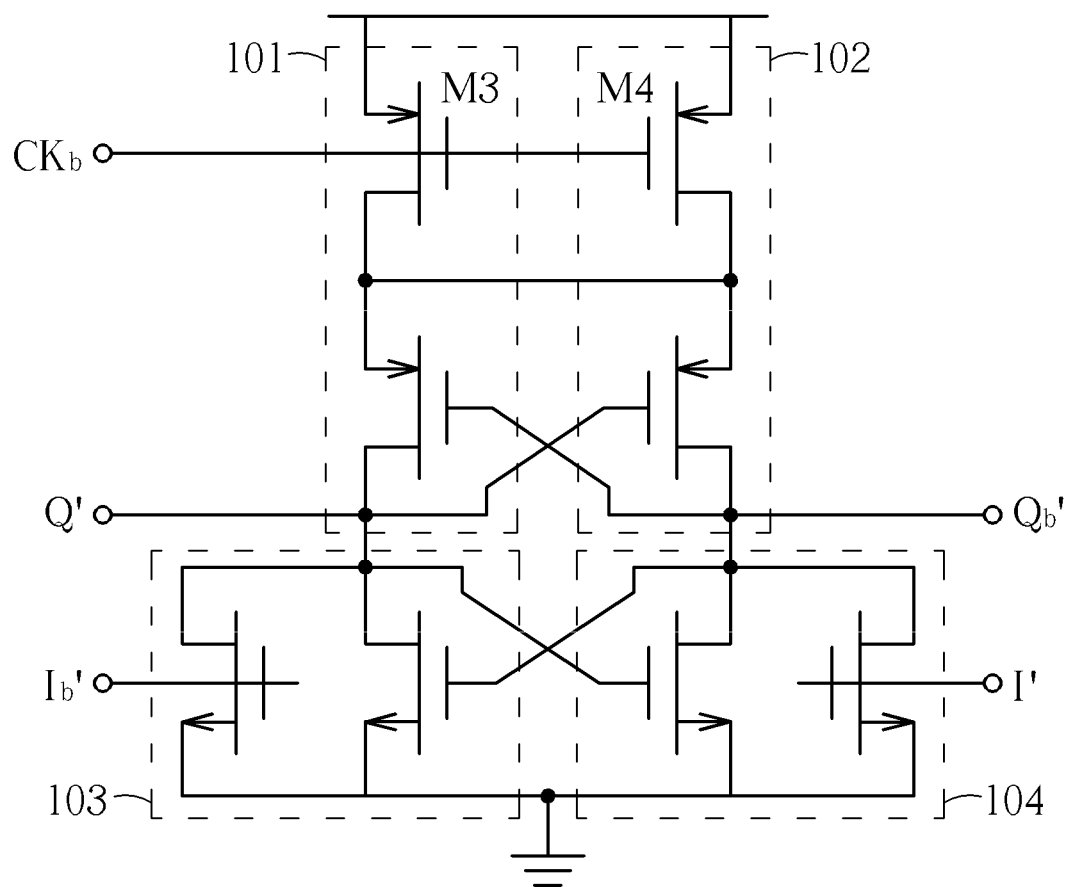
FIG. 27 is a diagram illustrating an eighth exemplary implementation of the frequency divider in FIG. 1 that is arranged for generating output clock signal(s) having the duty cycle substantially equal to 25%.

Regarding a fourth exemplary frequency divider design, one of the first frequency dividing circuit 202 and the second frequency dividing circuit 204 may be realized by the exemplary frequency divider implementation shown in FIG. 20, and the other of the first frequency dividing circuit 202 and the second frequency dividing circuit 204 may be realized by the exemplary frequency divider implementation shown in FIG. 24. Regarding a fifth exemplary frequency divider design, one of the first frequency dividing circuit 202 and the second frequency dividing circuit 204 may be realized by the exemplary frequency divider implementation shown in FIG. 21, and the other of the first frequency dividing circuit 202 and the second frequency dividing circuit 204 may be realized by the exemplary frequency divider implementation shown in FIG. 25. Regarding a sixth exemplary frequency divider design, one of the first frequency dividing circuit 202 and the second frequency dividing circuit 204 may be realized by the exemplary frequency divider implementation shown in FIG. 22 or FIG. 23, and the other of the first frequency dividing circuit 202 and the second frequency dividing circuit 204 may be realized by the exemplary frequency divider implementation shown in FIG. 26 or FIG. 27.

Please note that the exemplary frequency divider implementations shown in FIG. 12-FIG. 27 are for illustrative purposes only. That is, without departing the spirit of the present invention, other exemplary frequency divider implementations based on the circuit architecture shown in FIG. 1 are feasible. For example, with proper setting of the second clock signal CLK_2, the fourth clock signal CLK_4, the fifth clock signal CLK_5, and the sixth clock signal CLK_6, the frequency divider 100 may provide each output clock signal have a duty cycle different from an input clock signal's duty cycle by employing the logic circuit 502 to realize each of the first logic circuit 101 and the second logic circuit 102 and employing the logic circuit 402 to realize each of the third logic circuit 103 and the fourth logic circuit 104. Similarly, with proper setting of the second clock signal CLK_2, the fourth clock signal CLK_4, the fifth clock signal CLK_5, and the sixth clock signal CLK_6, the frequency divider 100 may provide each output clock signal have a duty cycle different from an input clock signal's duty cycle by employing the logic circuit 302 to realize each of the first logic circuit 101 and the second logic circuit 102 and employing the logic circuit 602 to realize each of the third logic circuit 103 and the fourth logic circuit 104. These alternative designs all fall within the scope of the present invention.

Figure 29:
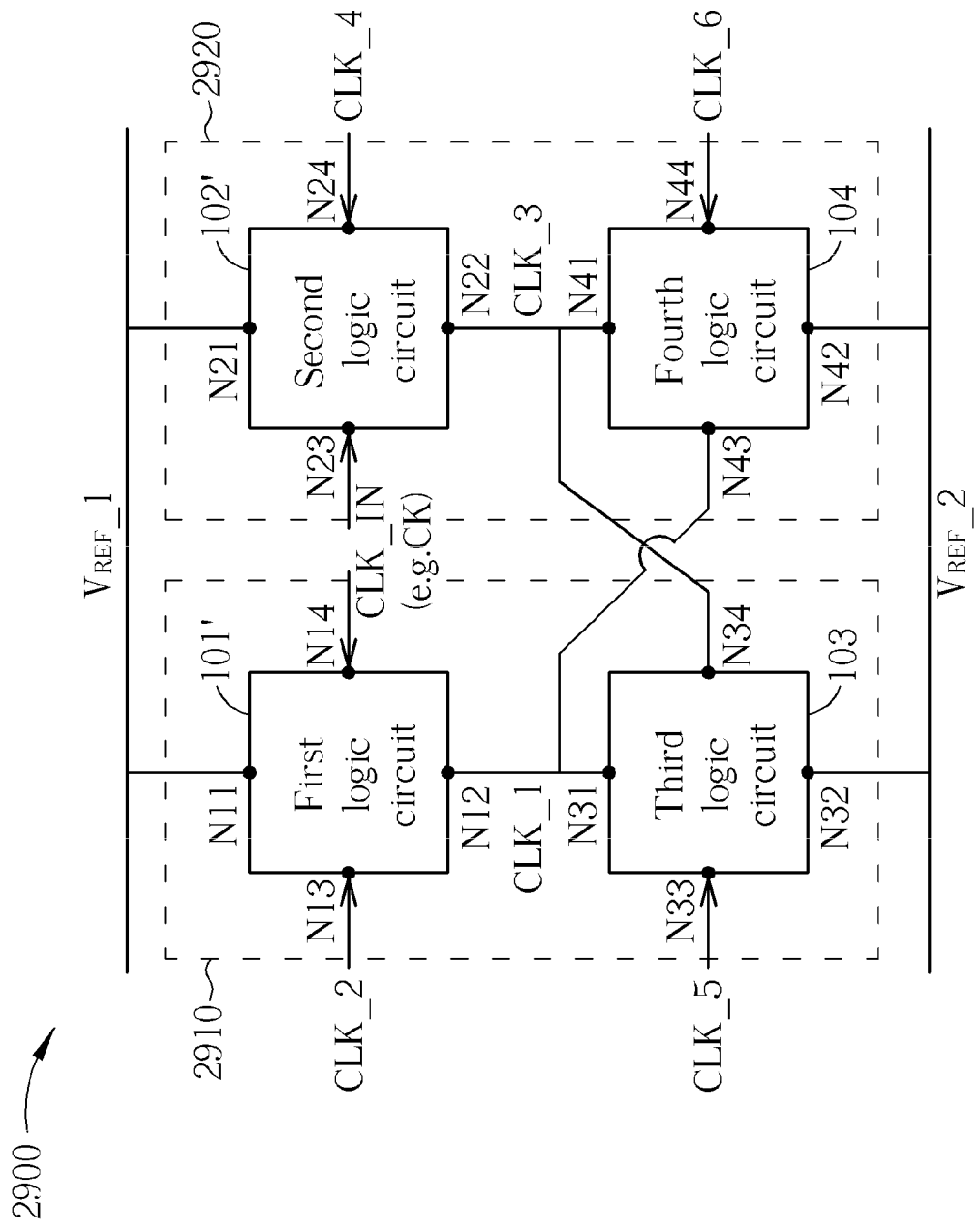
FIG. 29 is a diagram illustrating a frequency divider according to a third exemplary embodiment of the present invention.
Figure 34:
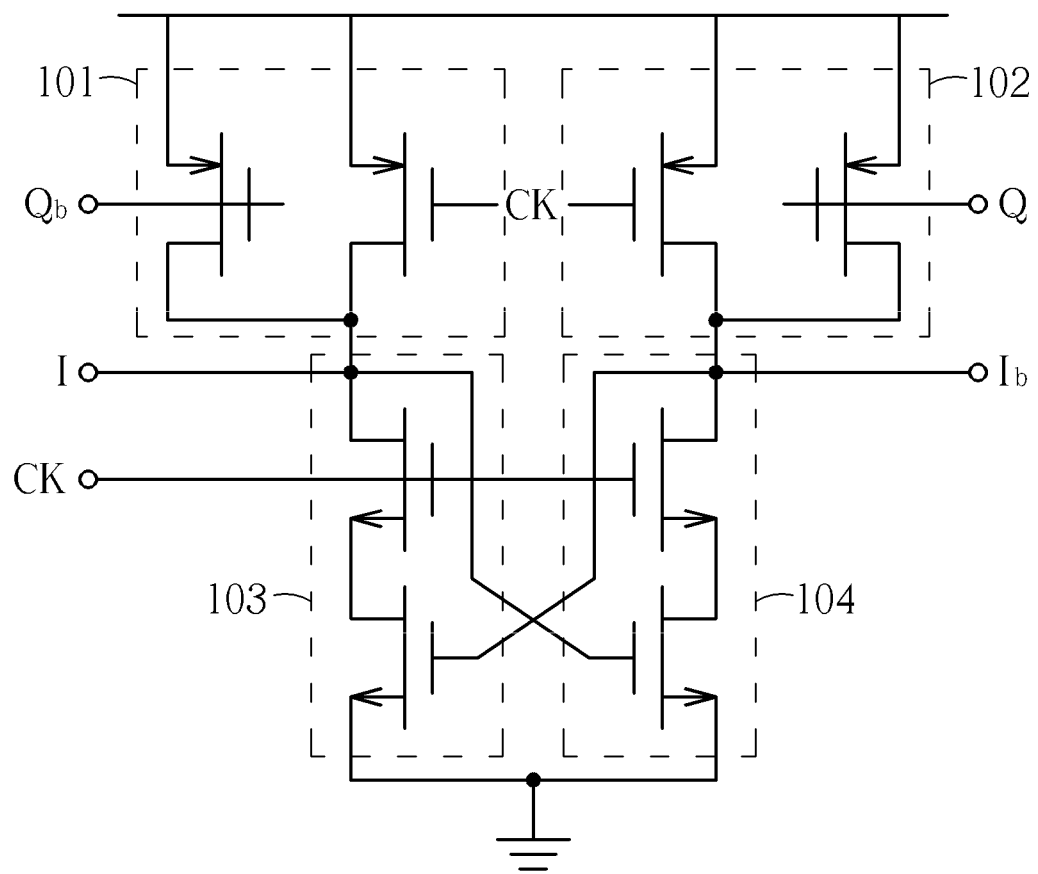
FIG. 34 is a diagram illustrating a first exemplary implementation of the frequency divider in FIG. 29 that is arranged for generating output clock signal(s) having the duty cycle substantially equal to 75%.
Figure 35:
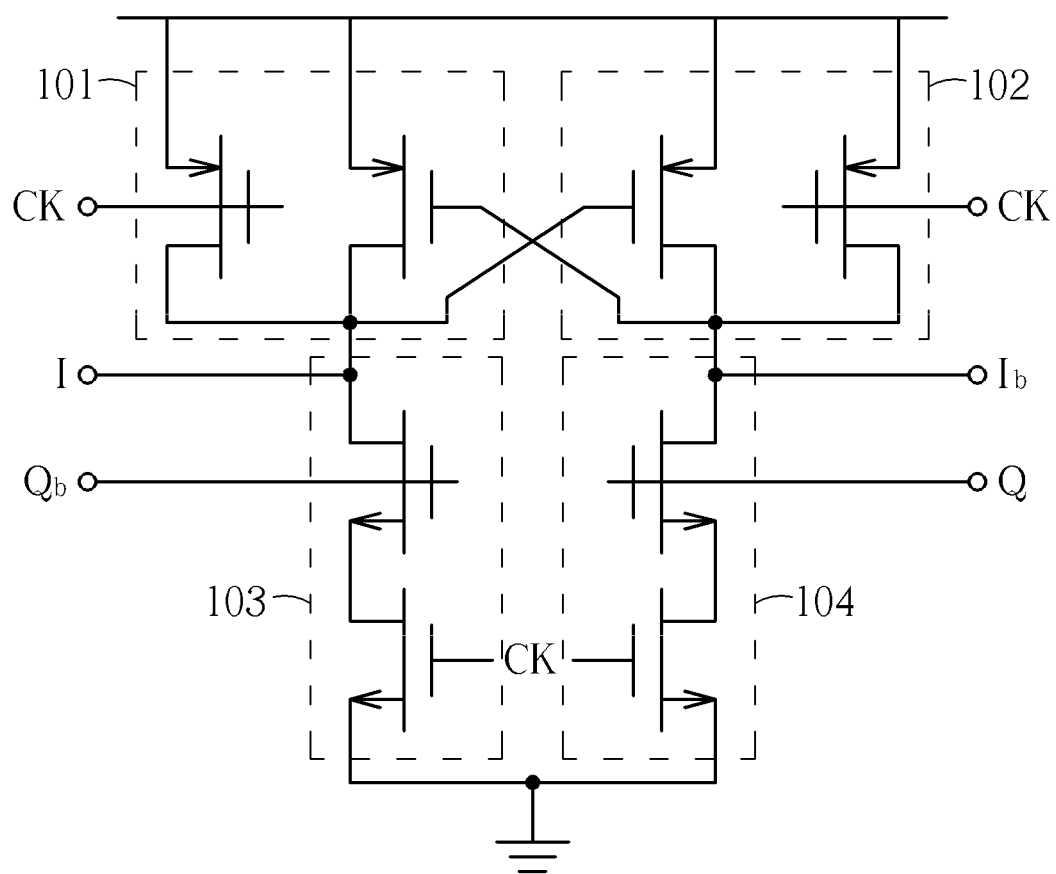
FIG. 35 is a diagram illustrating a second exemplary implementation of the frequency divider in FIG. 29 that is arranged for generating output clock signal(s) having the duty cycle substantially equal to 75%.
Figure 36:
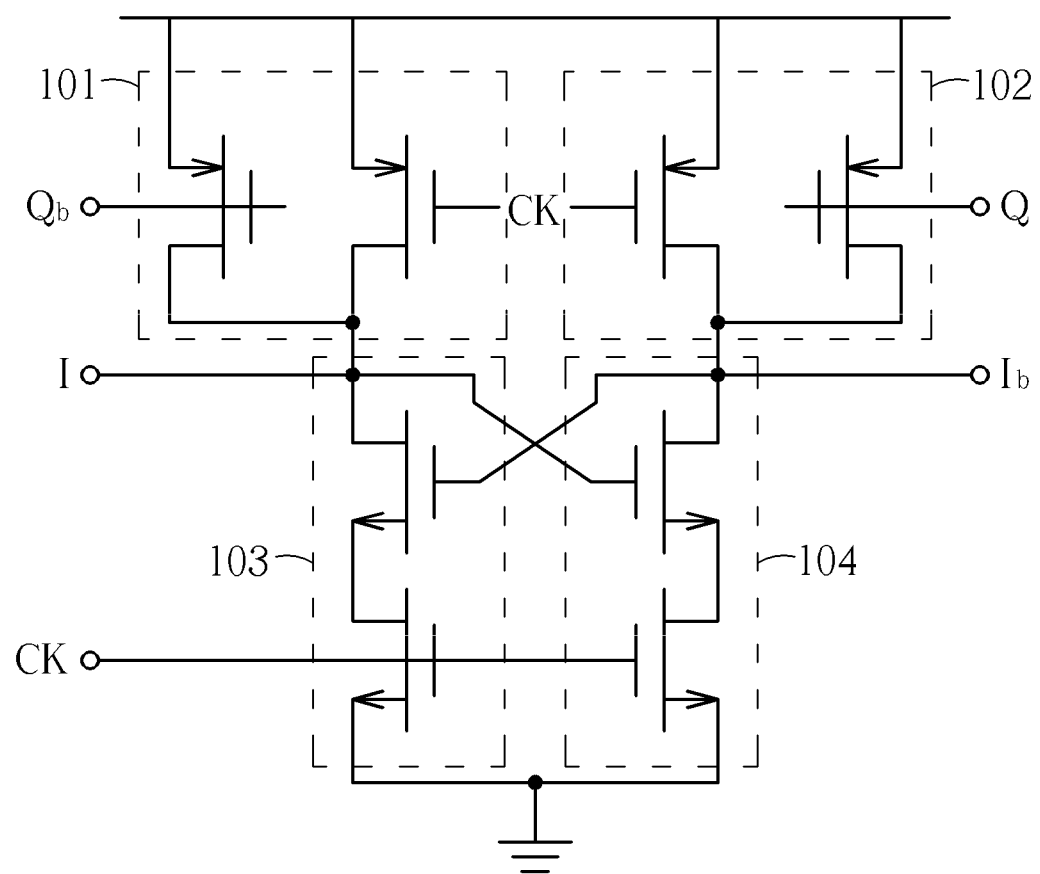
FIG. 36 is a diagram illustrating a third exemplary implementation of the frequency divider in FIG. 29 that is arranged for generating output clock signal(s) having the duty cycle substantially equal to 75%.
Figure 37:
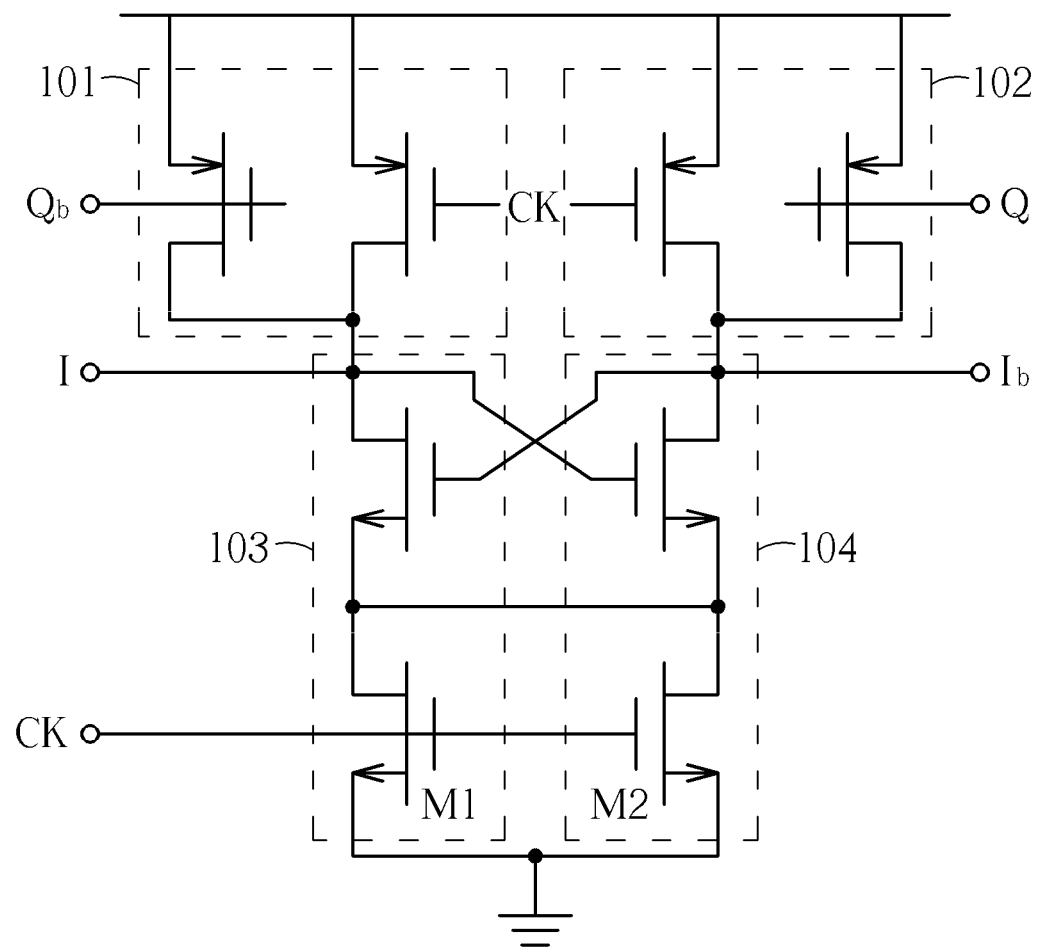
FIG. 37 is a diagrams illustrating a fourth exemplary implementation of the frequency divider in FIG. 29 that is arranged for generating output clock signal(s) having the duty cycle substantially equal to 75%.
Figure 38:
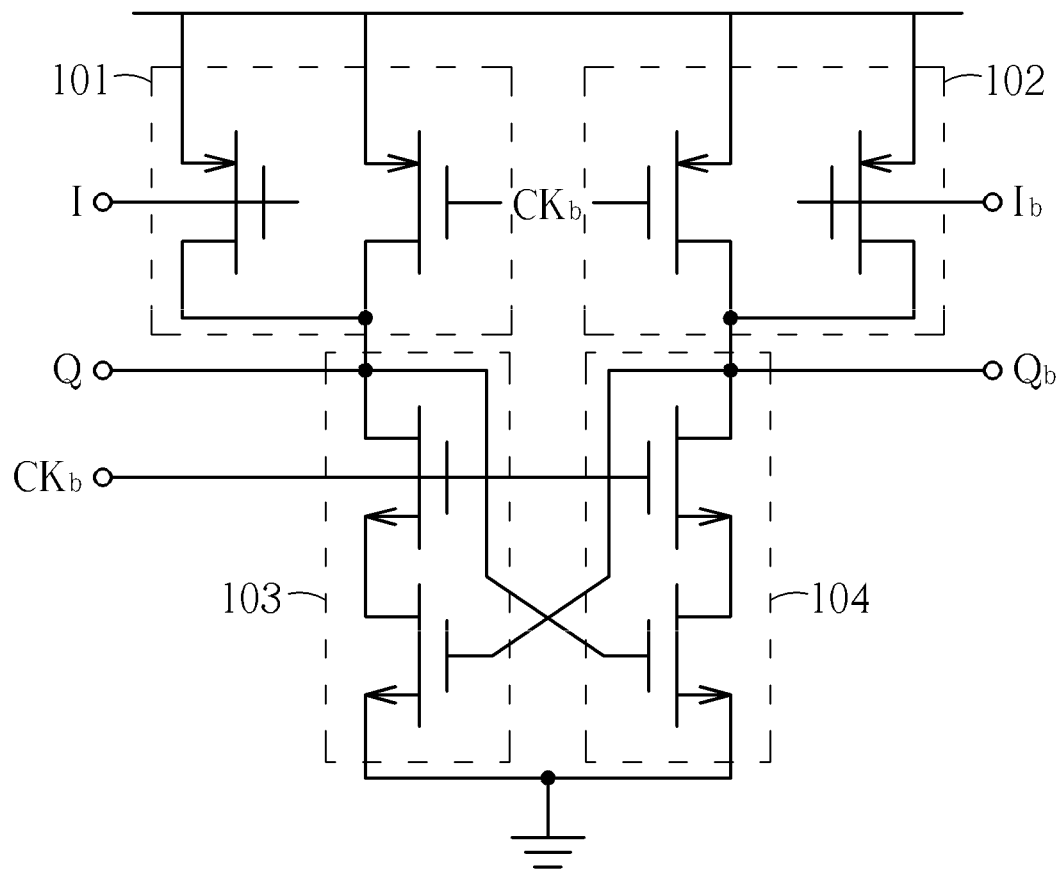
FIG. 38 is a diagram illustrating a fifth exemplary implementation of the frequency divider in FIG. 29 that is arranged for generating output clock signal(s) having the duty cycle substantially equal to 75%.
Figure 39:
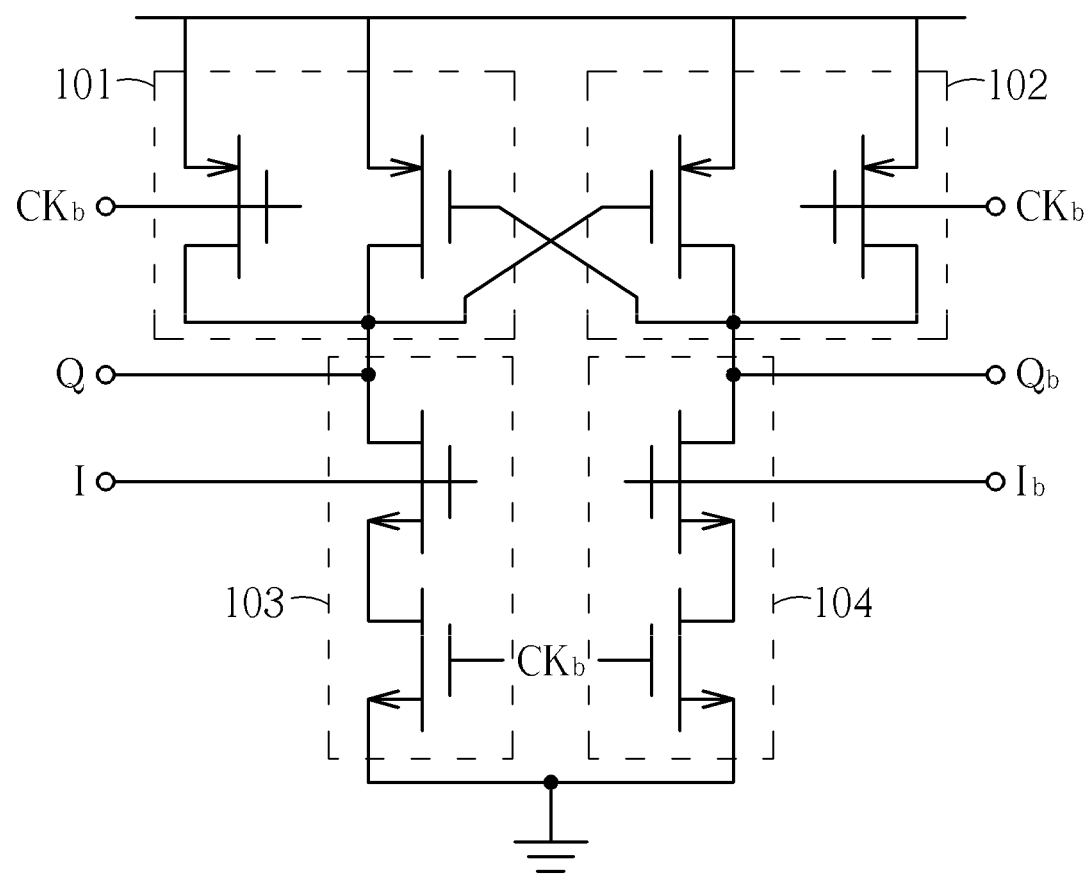
FIG. 39 is a diagram illustrating a sixth exemplary implementation of the frequency divider in FIG. 29 that is arranged for generating output clock signal(s) having the duty cycle substantially equal to 75%.
Figure 40:
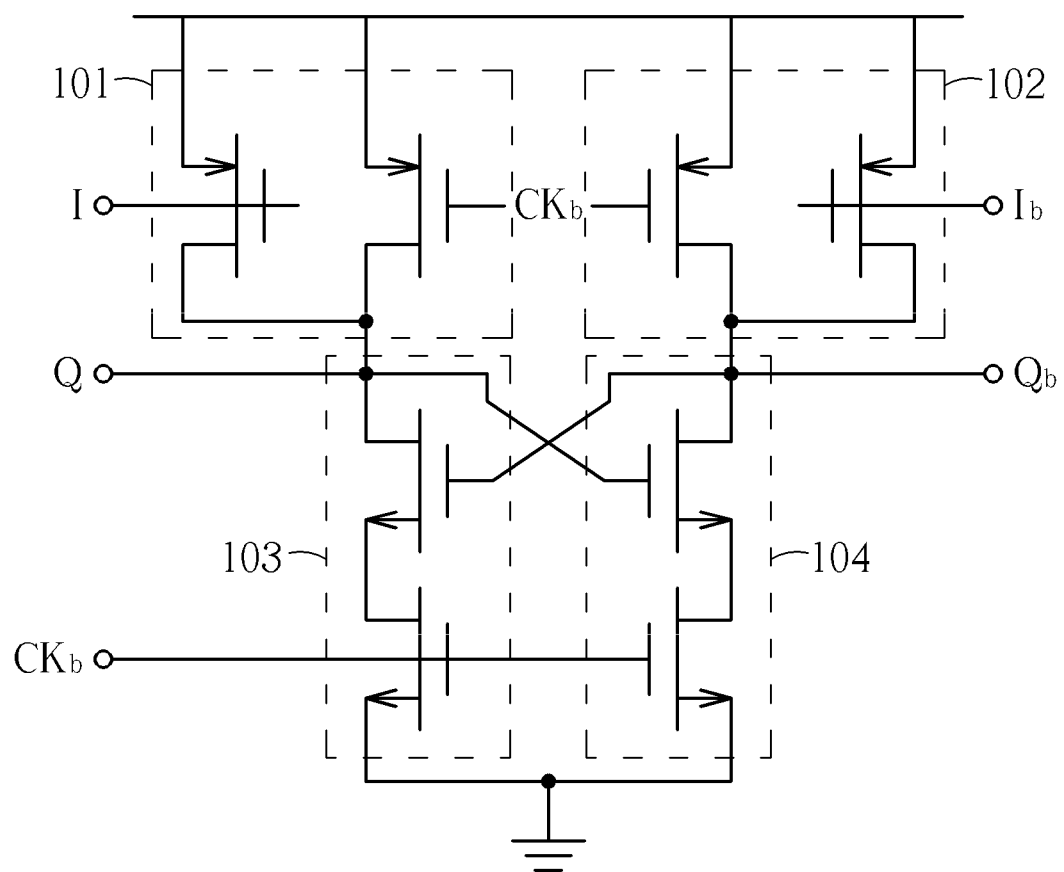
FIG. 40 is a diagram illustrating a seventh exemplary implementation of the frequency divider in FIG. 29 that is arranged for generating output clock signal(s) having the duty cycle substantially equal to 75%.
Figure 41:
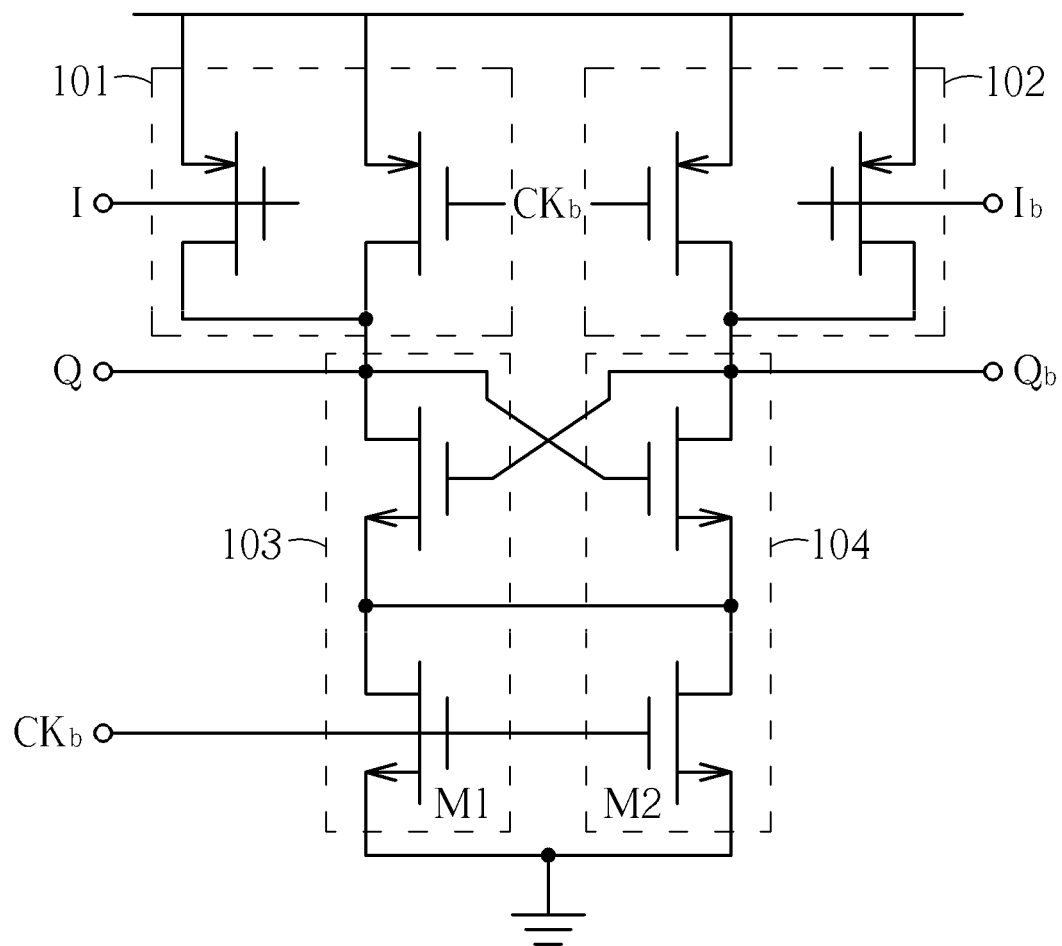
FIG. 41 is a diagram illustrating an eighth exemplary implementation of the frequency divider in FIG. 29 that is arranged for generating output clock signal(s) having the duty cycle substantially equal to 75%.
Figure 42:
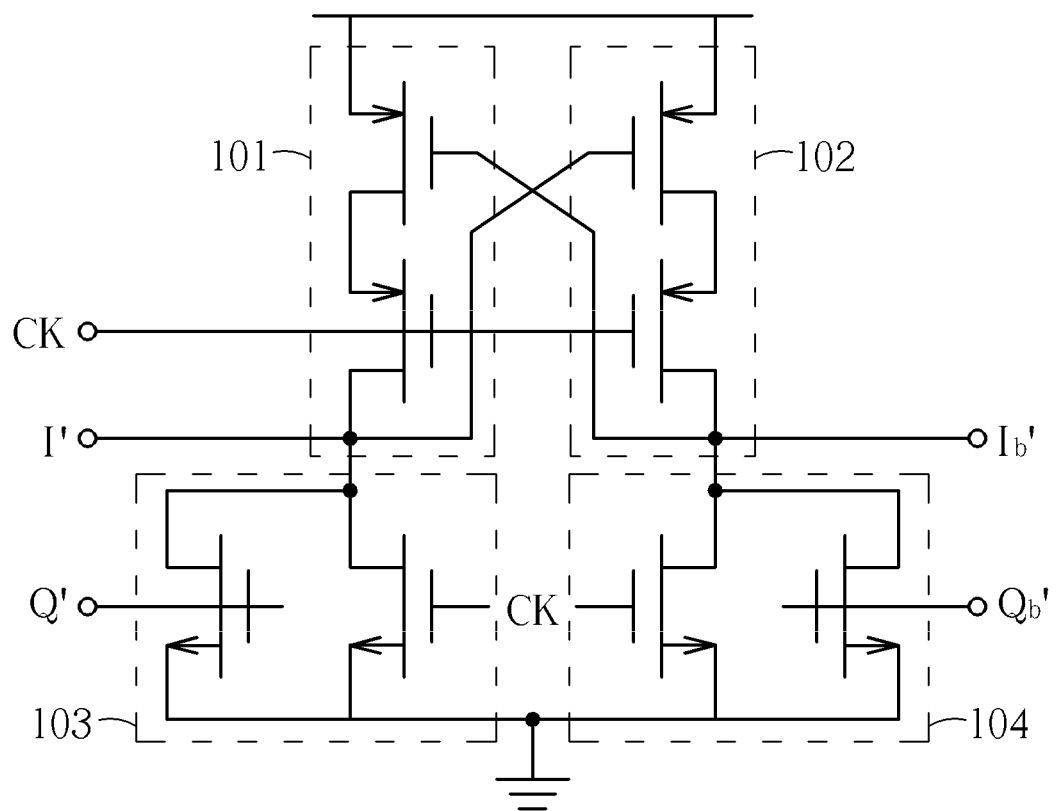
FIG. 42 is a diagram illustrating a first exemplary implementation of the frequency divider in FIG. 29 that is arranged for generating output clock signal(s) having the duty cycle substantially equal to 25%.
Figure 43:
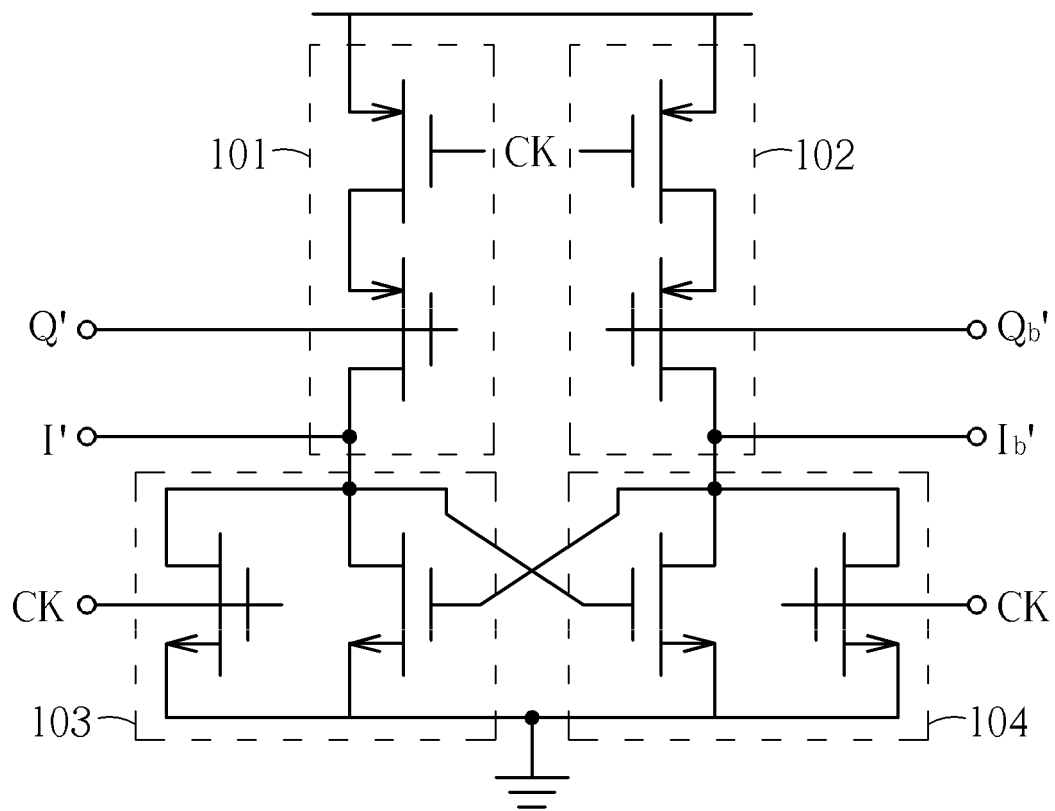
FIG. 43 is a diagram illustrating a second exemplary implementation of the frequency divider in FIG. 29 that is arranged for generating output clock signal(s) having the duty cycle substantially equal to 25%.
Figure 44:
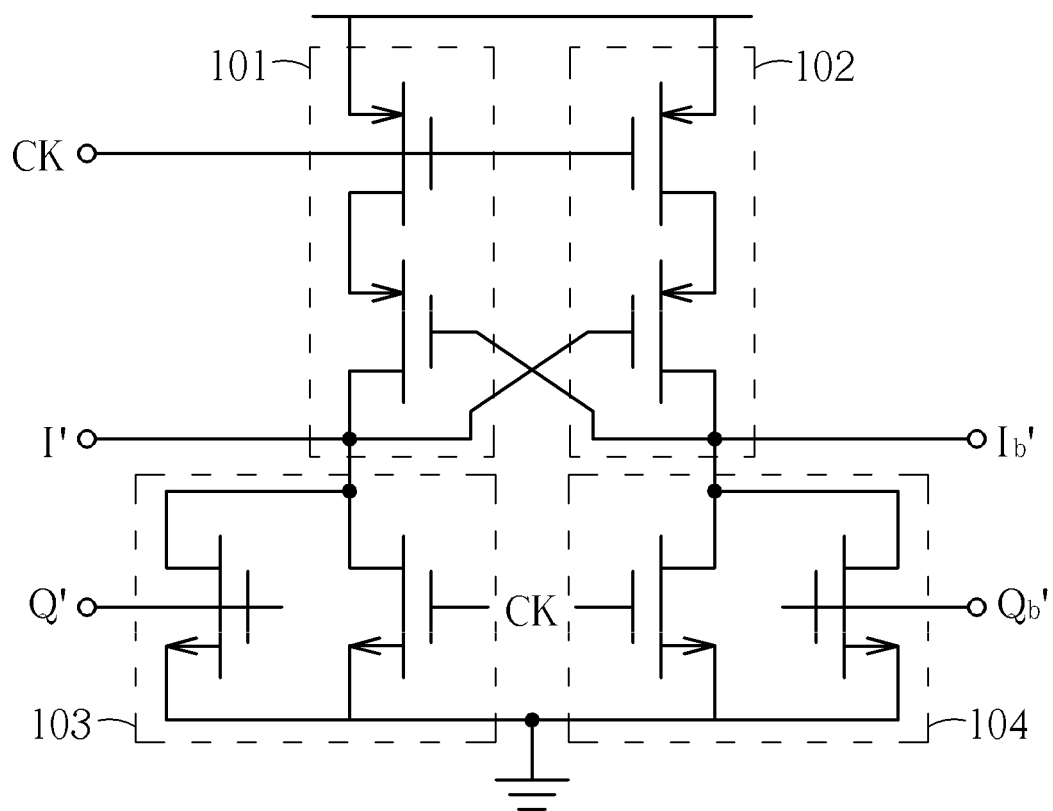
FIG. 44 is a diagram illustrating a third exemplary implementation of the frequency divider in FIG. 29 that is arranged for generating output clock signal(s) having the duty cycle substantially equal to 25%.
Figure 45:
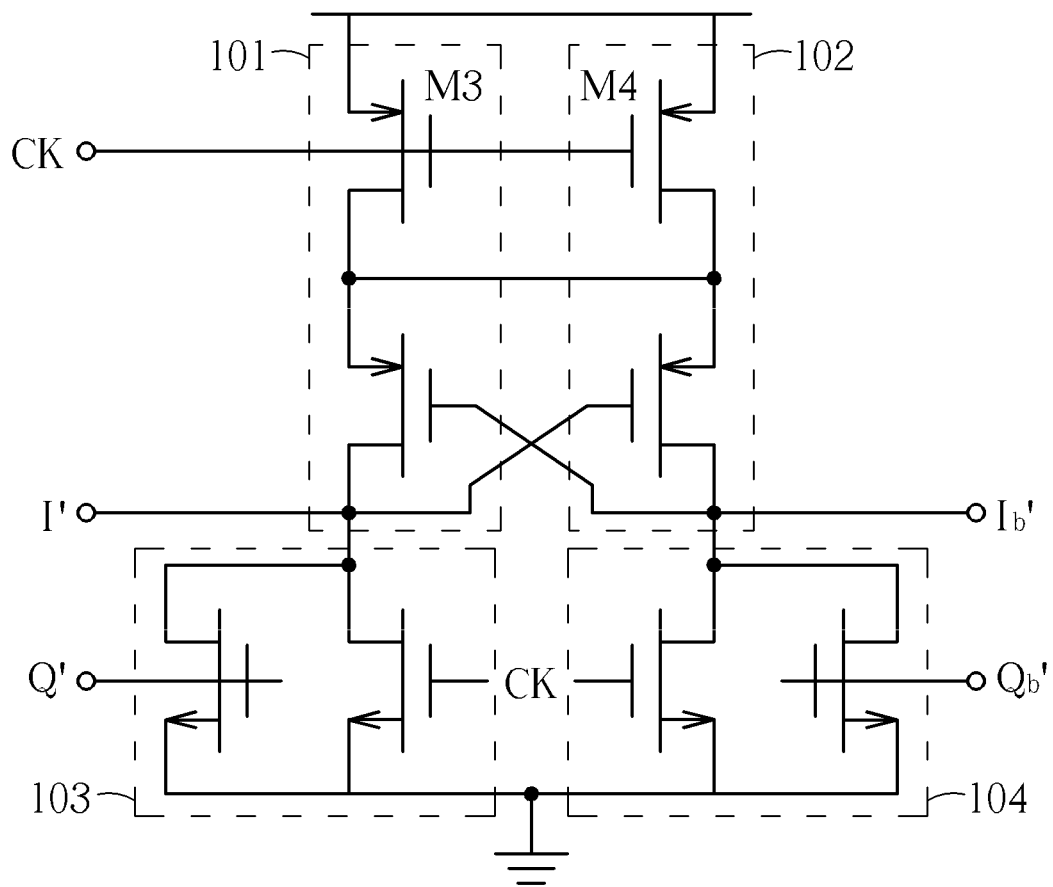
FIG. 45 is a diagram illustrating a fourth exemplary implementation of the frequency divider in FIG. 29 that is arranged for generating output clock signal(s) having the duty cycle substantially equal to 25%.
Figure 46:
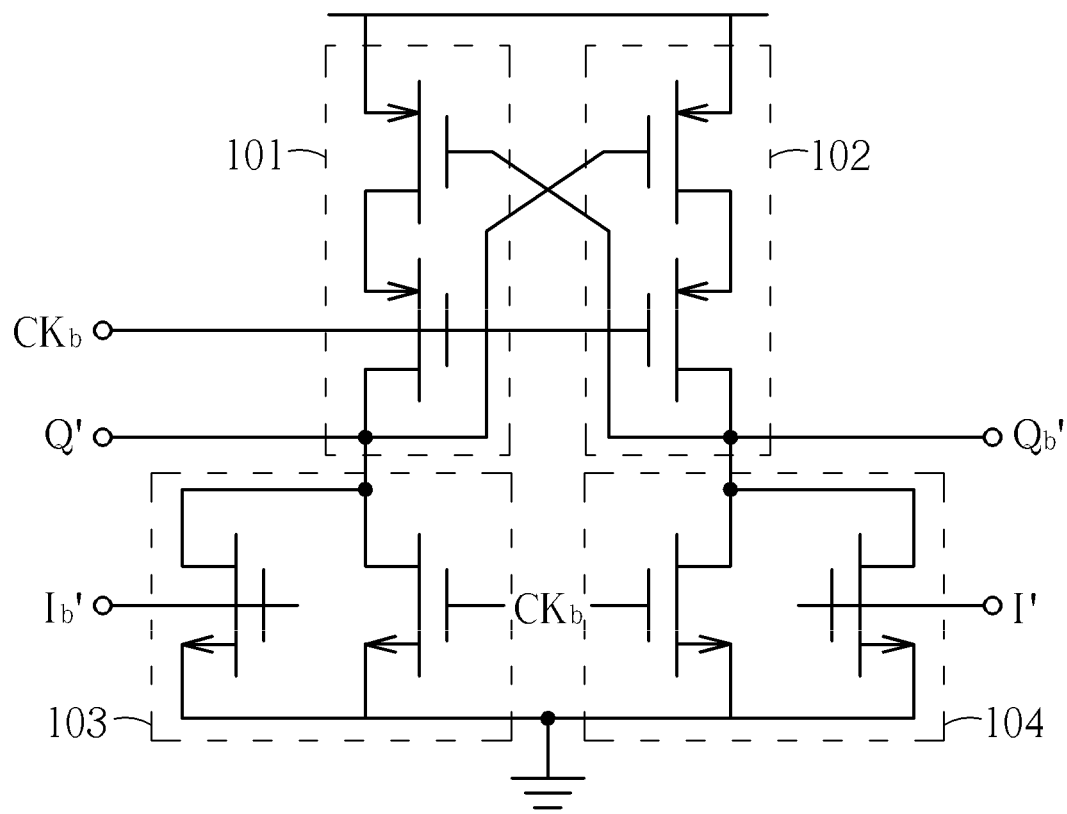
FIG. 46 is a diagram illustrating a fifth exemplary implementation of the frequency divider in FIG. 29 that is arranged for generating output clock signal(s) having the duty cycle substantially equal to 25%.
Figure 47:
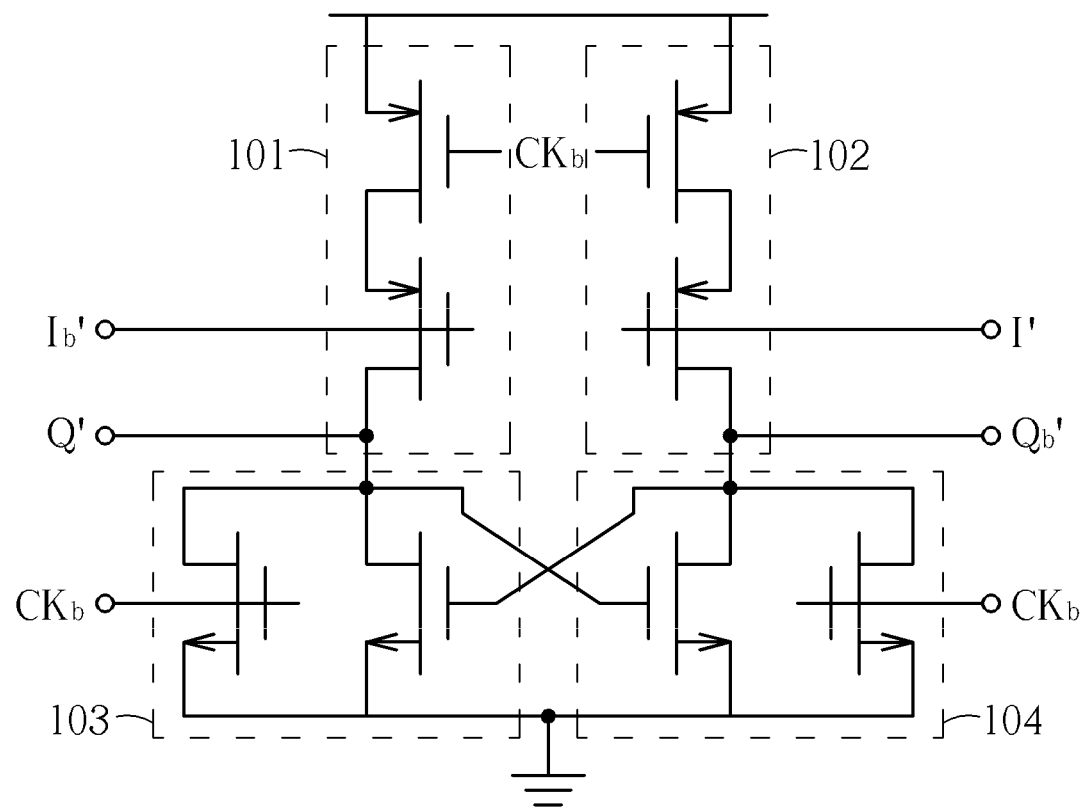
FIG. 47 is a diagram illustrating a sixth exemplary implementation of the frequency divider in FIG. 29 that is arranged for generating output clock signal(s) having the duty cycle substantially equal to 25%.
Figure 48:
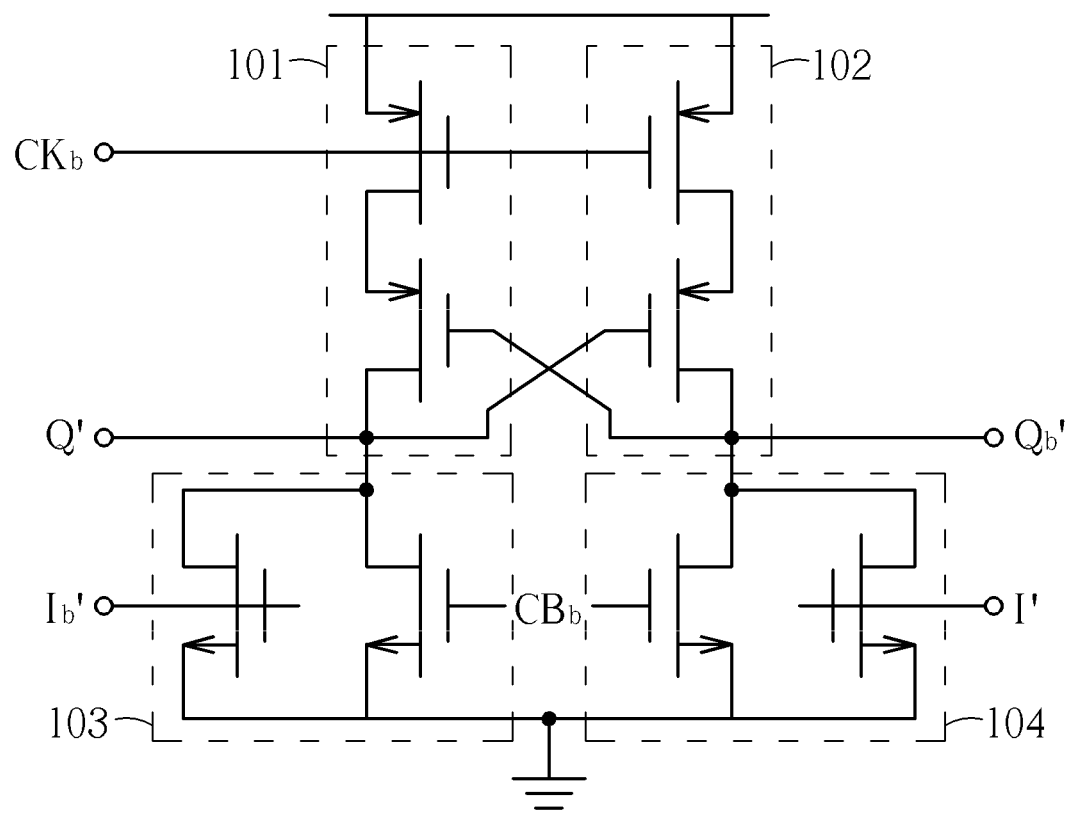
FIG. 48 is a diagram illustrating a seventh exemplary implementation of the frequency divider in FIG. 29 that is arranged for generating output clock signal(s) having the duty cycle substantially equal to 25%.
Figure 49:
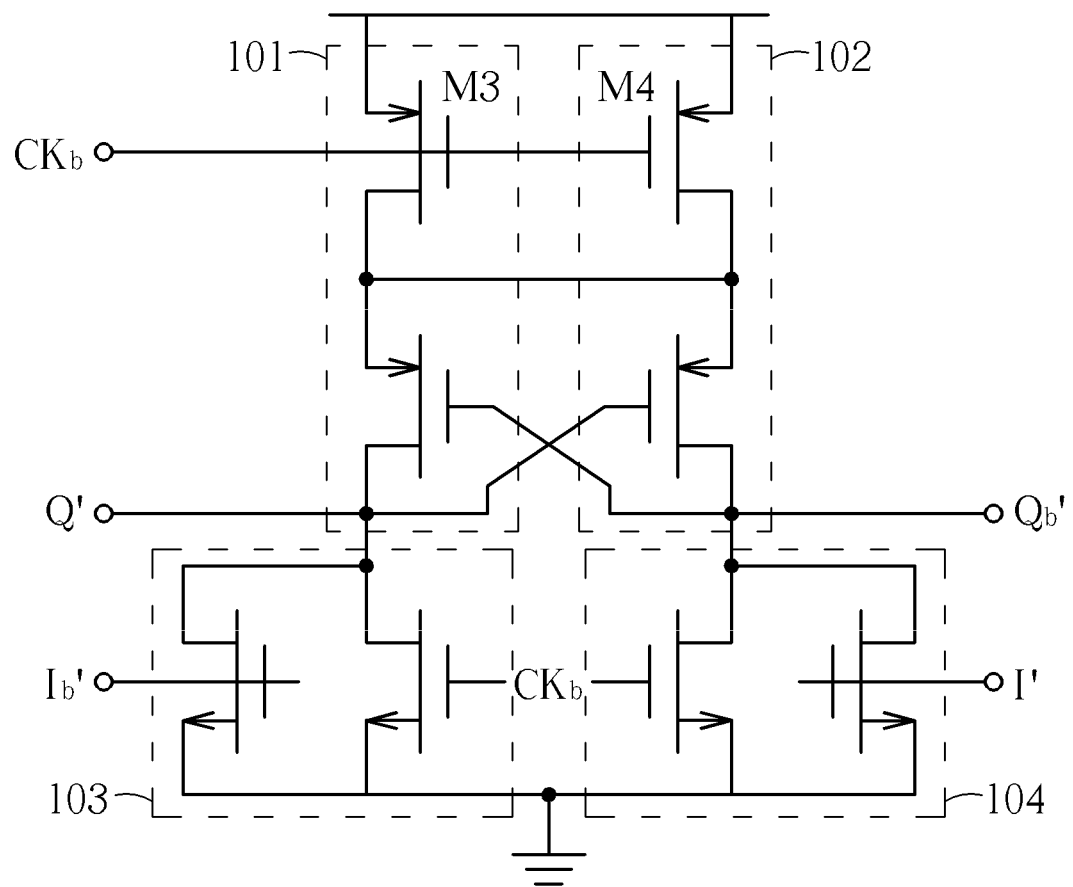
FIG. 49 is a diagram illustrating an eighth exemplary implementation of the frequency divider in FIG. 29 that is arranged for generating output clock signal(s) having the duty cycle substantially equal to 25%.

Please refer to FIG. 1 in conjunction with FIG. 29. FIG. 29 is a diagram illustrating a frequency divider according to a third exemplary embodiment of the present invention. The frequency divider 2900 shown in FIG. 29 is similar to the frequency divider 100 shown in FIG. 1, and the major different between them is the number of cross-coupled connections. More specifically, the exemplary frequency divider 2900 includes, but is not limited to, a plurality of logic circuit blocks including a first logic circuit block 2910 and a second logic circuit block 2920. The logic circuit blocks are realized using a plurality of logic circuits including a first logic circuit 101', a second logic circuit 102', the third logic circuit 103, and the fourth logic circuit 104. As can be seen from FIG. 29, the first logic circuit block 2910 of this exemplary embodiment includes the first logic circuit 101' and the third logic circuit 103, and the second logic circuit block 2920 of this exemplary embodiment includes the second logic circuit 102' and the fourth logic circuit 104. Moreover, the fourth node N14 of the first logic circuit 101' and the third node N23 of the second logic circuit 102' are arranged to receive the input clock signal CLK_IN (e.g., CK) having the first duty cycle (e.g., a duty cycle substantially equal to 50%). It should be noted that the first reference voltage $V_{REF\_1}$ is different from the second reference voltage $V_{REF\_2}$. In one exemplary embodiment, the first reference voltage $V_{REF\_1}$ may be higher than the second reference voltage $V_{REF\_2}$; however, in another exemplary embodiment, the first reference voltage $V_{REF\_1}$ may be lower than the second reference voltage $V_{REF\_2}$. To put it simply, the first reference voltage $V_{REF\_1}$ and the second reference voltage $V_{REF\_2}$ should be properly set according to the actual configuration of the frequency divider 2910.

Similarly, the frequency divider 2900 shown in FIG. 29 may be implemented using a combination of the aforementioned logic circuits 302, 402, 502, and 602. More specifically, each of the first logic circuit 101', the second logic circuit 102', the third logic circuit 103, and the fourth logic circuit 104 may be realized using one logic circuit selected from the logic circuits 302, 402, 502, and 602, where the inputs at the control terminals of transistors in the selected logic circuit should be properly configured according to actual design requirement. Please refer to FIG. 30-FIG. 33. FIG. 30 shows another table illustrating connection configurations of the logic circuit 302 shown in FIG. 3. FIG. 31 shows another table illustrating connection configurations of the logic circuit 402 shown in FIG. 4. FIG. 32 shows another table illustrating connection configurations of the logic circuit 502 shown in FIG. 8. FIG. 33 shows another table illustrating connection configurations of the logic circuit 602 shown in FIG. 10. It should be noted that each table shown in FIG. 30-FIG. 33 simply shows possible options of signals which may be presented at nodes of the logic circuits 302/402/502/ 602 when the logic circuit 302/402/502/602 is employed in a frequency divider. Actually, the logic circuit 302/402/502/ 602 has to collaborate with other logic circuit(s) also implemented in the frequency divider to make the output signal Z become a clock signal which switches to the logic high level "1" and the logic low level "0" alternately.

By way of example, but not limitation, each of the first logic circuit 101' and the second logic circuit 102' of the frequency divider 2900 may be implemented using the logic circuit 302 shown in FIG. 3, and each of the third logic circuit 103 and the fourth logic circuit 104 of the frequency divider 2900 may be implemented using the logic circuit 402 shown in FIG. 5. FIG. 34-FIG. 41 are diagrams illustrating exemplary implementations of the frequency divider 2900 in FIG. 29 that is arranged for generating output clock signal(s) having the duty cycle substantially equal to 75%. In a case where the following signal processing stage requires a clock signal with a duty cycle substantially equal to 25%, an inverter may be employed to convert the frequency divider output with the duty cycle substantially equal to 75% into a desired clock signal with a duty cycle substantially equal to 25%. In an alternative design, each of the first logic circuit 101' and the second logic circuit 102' of the frequency divider 2900 may be implemented using the logic circuit 502 shown in FIG. 8, and each of the third logic circuit 103 and the fourth logic circuit 104 of the frequency divider 2900 may be implemented using the logic circuit 602 shown in FIG. 10. FIG. 42-FIG. 49 are diagrams illustrating exemplary implementations of the frequency divider 2900 in FIG. 29 that is arranged for generating output clock signal(s) having the duty cycle substantially equal to 25%. As a person skilled in the art can readily understand operations of these exemplary implementations of the frequency divider 2900 after reading above paragraphs in view of the exemplary tables shown in FIG. 30-FIG. 33, further description is omitted here for brevity.

Figure 50:
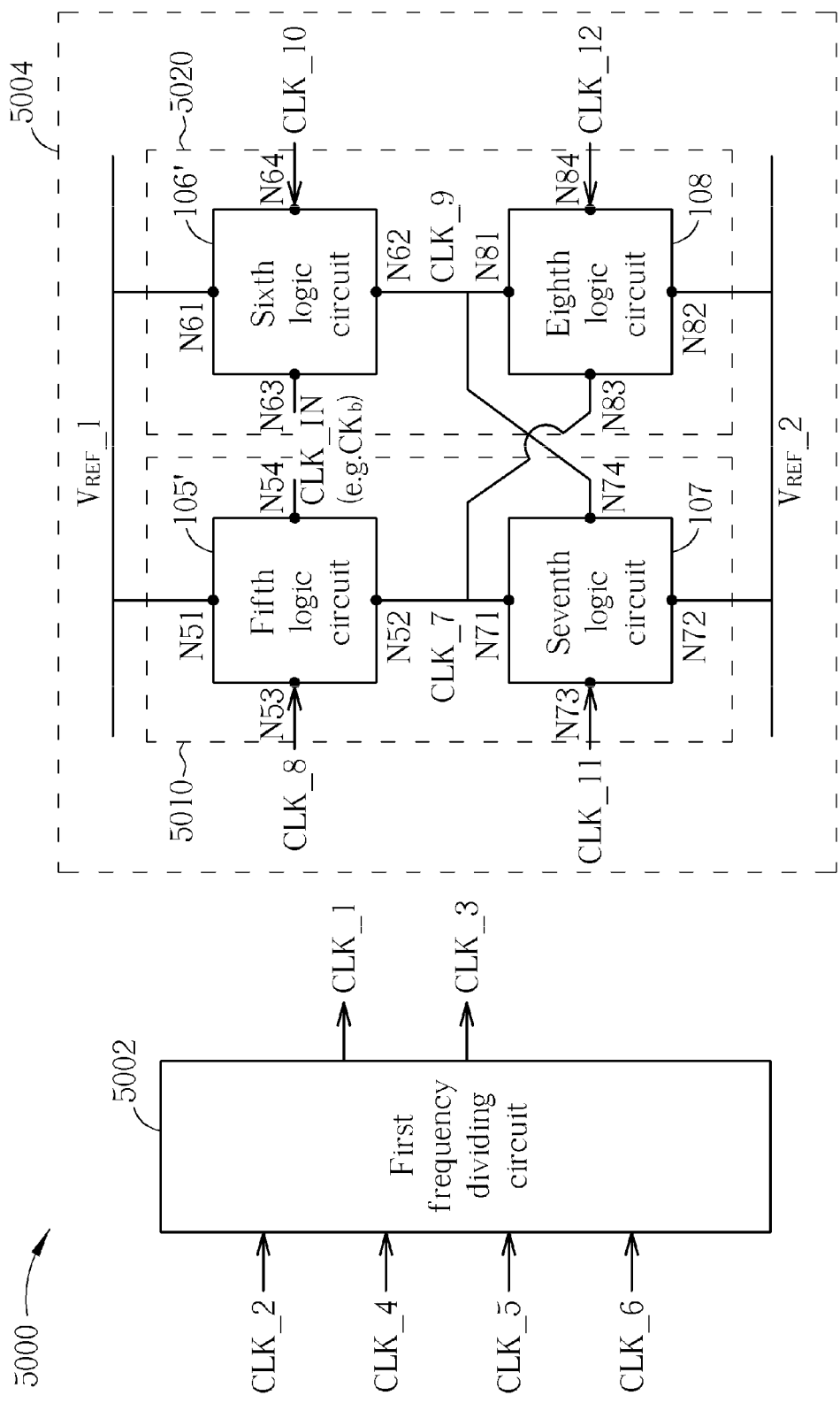
FIG. 50 is a diagram illustrating a frequency divider according to a fourth exemplary embodiment of the present invention.

Similarly, at least one clock signal with the second duty cycle may be provided by a conventional frequency divider, for example, using the clock-gating technique, or provided by another frequency dividing circuit using the same frequency divider architecture shown in FIG. 1. Consider a case where at least one clock signal with the second duty cycle is generated by another frequency dividing circuit using the same frequency divider architecture shown in FIG. 29. Please refer to FIG. 50 in conjunction with FIG. 28 and FIG. 29. FIG. 50 shows a frequency divider according to a fourth exemplary embodiment of the present invention. The exemplary frequency divider 5000 includes a first frequency dividing circuit 5002 and a second frequency dividing circuit 5004, wherein the first frequency dividing circuit 5002 is implemented using the frequency divider 2900 shown in FIG. 29. In this exemplary embodiment, the first frequency dividing circuit 5002 is arranged for processing the above-mentioned first input clock signal with the first duty cycle, and the second frequency dividing circuit 5004 is arranged for processing a second input clock signal with the first duty cycle, wherein the first input clock signal and the second input clock signal have a 180-degree phase difference therebetween. For example, one of the first input clock signal and the second input clock signal is the clock signal CK shown in FIG. 2/FIG. 7, and the other of the first input clock signal and the second input clock signal is the clock signal $CK_b$ shown in FIG. 2/FIG. 7.

As shown in FIG. 50, the second frequency dividing circuit 5004 of the frequency divider 5000 includes a plurality of logic circuit blocks, such as a third logic circuit block 5010 and a fourth logic circuit block 5020. The logic circuit blocks of the second frequency dividing circuit 5004 are realized using a plurality of logic circuits including a fifth logic circuit 105', a sixth logic circuit 106, the seventh logic circuit 107, and the eighth logic circuit 108. As can be seen from FIG. 50, the third logic circuit block 5010 of this exemplary embodiment includes the fifth logic circuit 105' and the seventh logic circuit 107, and the fourth logic circuit block 5020 includes the sixth logic circuit 106' and the eighth logic circuit 108. It should be noted that the fourth node N54 of the fifth logic circuit 105' and the third node N63 of the sixth logic circuit 106' are arranged to receive the input clock signal CLK_IN (e.g., $CK_b$) having the first duty cycle (e.g., a duty cycle substantially equal to 50%).

Similarly, the second frequency dividing circuit 5004 of the frequency divider 5000 may be implemented using a combination of the aforementioned logic circuits 302, 402, 502, and 602. That is, the frequency divider 5000 may be realized by properly combining two of the exemplary circuits shown in FIG. 34-FIG. 41 or combining two of the exemplary circuits shown in FIG. 42-FIG. 49. For example, regarding the implementation of the frequency divider 5000 used for generating an output clock signal with a duty cycle substantially equal to 75%, the first frequency dividing circuit 5002 and the second frequency dividing circuit 5004 may be implemented using circuits shown in FIG. 34 and FIG. 38 (or FIG. 35 and FIG. 39, or FIG. 36 and FIG. 40, or FIG. 37 and FIG. 41). Regarding the implementation of the frequency divider 5000 used for generating an output clock signal with a duty cycle substantially equal to 25%, the first frequency dividing circuit 5002 and the second frequency dividing circuit 5004 may be implemented using circuits shown in FIG. 42 and FIG. 46 (or FIG. 43 and FIG. 47, or FIG. 44 and FIG. 48, or FIG. 45 and FIG. 49). As a person skilled in the art can readily understand how to configure the exemplary frequency divider 5000 after reading above paragraphs directed to the exemplary frequency divider 200 shown in FIG. 28, further description is omitted here for brevity.

It should be noted that the above examples directed to the configuration of the frequency divider 200/5000 are for illustrative purposes only. As long as the result is substantially the same, alternative implementations of the frequency divider 200/5000 are feasible. In a first alternative design, the first frequency dividing circuit 202 may be implemented using one of the circuits shown in FIG. 34-FIG. 37, and the second frequency dividing circuit 204 may be implemented using one of the circuits shown in FIG. 16-FIG. 19. In a second alternative design, the first frequency dividing circuit 5002 may be implemented using one of the circuits shown in FIG. 12-FIG. 15, and the second frequency dividing circuit 204 may be implemented using one of the circuits shown in FIG. 38-FIG. 41. In a third alternative design, the first frequency dividing circuit 202 may be implemented using one of the circuits shown in FIG. 42-FIG. 45, and the second frequency dividing circuit 204 may be implemented using one of the circuits shown in FIG. 24-FIG. 27. In a fourth alternative design, the first frequency dividing circuit 5002 may be implemented using one of the circuits shown in FIG. 20-FIG. 23, and the second frequency dividing circuit 5004 may be implemented using one of the circuits shown in FIG. 46-FIG. 49. These still obey the spirit of the present invention, and fall within the scope of the present invention.

The aforementioned exemplary frequency divider proposed in the present invention may be employed by any application requiring a clock signal with a duty cycle different from 50%. For example, a wireless communication receiver or a wireless communication transmitter may use the proposed exemplary frequency divider to generate the needed LO signals with a duty cycle of 25%. Regarding the exemplary frequency divider design employing the circuit architecture shown in FIG. 28/FIG. 50, the generated clock signals I and $I_b$ may serve as LO signals fed into one mixer module positioned in an in-phase channel, and the generated clock signals Q and $Q_b$ may serve as LO signals fed into another mixer module positioned in a quadrature channel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency divider, comprising:
a plurality of logic circuit blocks, each comprising a plurality of control terminals;
wherein at least one of the control terminals of one of the logic circuit blocks is arranged to receive an input clock signal having a first duty cycle, at least one of the remaining control terminals of the one of the logic circuit blocks is arranged to couple another one of the logic circuit blocks by a positive feedback, a clock signal at the at least one of the remaining control terminals has a second duty cycle different from the first duty cycle, and each of the logic circuit blocks comprises:
a plurality of first transistors coupled in parallel between a first reference voltage and an output terminal; and
a plurality of second transistors coupled in series between a second reference voltage and the output terminal.

2. The frequency divider of claim 1, wherein the logic circuit blocks include a first logic circuit block and a second logic circuit block.

3. The frequency divider of claim 2, wherein a control terminal of one of the second transistors and a connection terminal of the other of the second transistors in the first logic circuit block are cross-coupled to a connection terminal of one of the second transistors and a control terminal of the other of the second transistors in the second logic circuit block by the positive feedback.

4. The frequency divider of claim 3, wherein a control terminal of the other of the second transistors in the first logic circuit block is arranged to receive the input clock signal or a clock signal having the second duty cycle.

5. The frequency divider of claim 3, wherein a control terminal and a connection terminal of one of the first transistors in the first logic circuit block are cross-coupled to a connection terminal and a control terminal of one of the first transistors in the second logic circuit block, and a control terminal of the other of the first transistors in the first logic circuit block is arranged to receive the input clock signal or a clock signal having the second duty cycle.

6. The frequency divider of claim 3, wherein a control terminal of one of the first transistors in the first logic circuit block is arranged to receive the input clock signal, and a control terminal of the other of the first transistors in the first logic circuit block is arranged to receive a clock signal having the second duty cycle.

7. The frequency divider of claim 2, wherein a control terminal and a connection terminal of one of the second transistors in the first logic circuit block are cross-coupled to a connection terminal and a control terminal of one of the second transistors in the second logic circuit block by the positive feedback.

8. The frequency divider of claim 7, wherein another connection terminal of the one of the second transistors in the first logic circuit block is coupled to another connection terminal of the one of the second transistors in the second logic circuit block.

9. The frequency divider of claim 7, wherein a control terminal of the other of the second transistors in the first logic circuit block is arranged to receive the input clock signal.

10. The frequency divider of claim 7, wherein a control terminal and a connection terminal of one of the first transistors in the first logic circuit block are cross-coupled to a connection terminal and a control terminal of one of the first transistors in the second logic circuit block, and a control terminal of the other of the first transistors in the first logic circuit block is arranged to receive a clock signal having the second duty cycle.

11. The frequency divider of claim 7, wherein a control terminal of one of the first transistors in the first logic circuit block is arranged to receive the input clock signal, and a control terminal of the other of the first transistors in the first logic circuit block is arranged to receive a clock signal having the second duty cycle.

12. The frequency divider of claim 2, wherein a control terminal and a connection terminal of one of the first transistors in the first logic circuit block are cross-coupled to a connection terminal and a control terminal of one of the first transistors in the second logic circuit block.

13. The frequency divider of claim 12, wherein a control terminal of the other of the first transistors in the first logic circuit block is arranged to receive the input clock signal or a clock signal having the second duty cycle.

14. The frequency divider of claim 12, wherein a control terminal of one of the second transistors in the first logic circuit block is arranged to receive the input clock signal, and a control terminal of the other of the second transistors in the first logic circuit block is arranged to receive a clock signal having the second duty cycle and is not cross-coupled to any transistor in the second logic circuit block.

15. The frequency divider of claim 1, wherein the first reference voltage is higher than the second reference voltage.

16. The frequency divider of claim 1, wherein the first reference voltage is lower than the second reference voltage.

17. The frequency divider of claim 1, wherein the second duty cycle is substantially 25% or 75%, and the first duty cycle is substantially 50%.

* * * * *